US012641975B2

(12) United States Patent
Lee et al.

(10) Patent No.:     US 12,641,975 B2
(45) Date of Patent:     May 26, 2026

(54) DISPLAY DEVICE

(71) Applicant: LG Display Co., Ltd., Seoul (KR)

(72) Inventors: Jinuk Lee, Paju-si (KR); Jungseop Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 378 days.

(21) Appl. No.: 18/512,896

(22) Filed: Nov. 17, 2023

(65) Prior Publication Data

US 2024/0206260 A1      Jun. 20, 2024

(30) Foreign Application Priority Data

Dec. 16, 2022     (KR) ......................... 10-2022-0176533

(51) Int. Cl.
*H10K 59/131*          (2023.01)
*H10K 59/40*           (2023.01)

(52) U.S. Cl.
CPC ........... *H10K 59/131* (2023.02); *H10K 59/40* (2023.02)

(58) Field of Classification Search
CPC .. H10K 59/131; H10K 59/40; H10K 59/8722; H10K 59/60; H10K 59/00; H04M 1/0266; G02F 1/1362; G02F 1/136286
See application file for complete search history.

(56) References Cited

U.S. PATENT DOCUMENTS

| | | | |
|---|---|---|---|
| 10,868,102 B1 | 12/2020 | Zhang et al. | |
| 10,872,571 B2 * | 12/2020 | Noh ..................... | G09G 3/3266 |
| 11,411,199 B2 * | 8/2022 | Seong ................ | H10K 59/1201 |

| | | | |
|---|---|---|---|
| 2016/0111487 A1 * | 4/2016 | Jeong ................. | H10K 59/1315 |
| | | | 257/40 |
| 2020/0161582 A1 | 5/2020 | Choi et al. | |
| 2021/0036022 A1 | 2/2021 | Han et al. | |
| 2021/0091165 A1 * | 3/2021 | Jeon ..................... | H10K 59/131 |
| 2021/0296408 A1 * | 9/2021 | Hong ........................ | G01L 5/22 |
| 2022/0037451 A1 | 2/2022 | Kwak et al. | |
| 2022/0181357 A1 * | 6/2022 | Xu ........................ | H10D 86/441 |

FOREIGN PATENT DOCUMENTS

| | | | | |
|---|---|---|---|---|
| CN | 109585519 A | * | 4/2019 | ........... H10K 59/131 |
| CN | 111244125 A | | 6/2020 | |
| CN | 113568231 A | | 10/2021 | |
| KR | 10-2020-0015868 A | | 2/2020 | |
| KR | 10-2021-0013846 A | | 2/2021 | |
| KR | 10-2022-0073115 A | | 6/2022 | |

* cited by examiner

*Primary Examiner* — Douglas W Owens

(74) *Attorney, Agent, or Firm* — Birch, Stewart, Kolasch & Birch, LLP

(57)     ABSTRACT

A display device includes a substrate where a display area including a plurality of pixels, a sensor hole area disposed in the display area, and a sensor non-display area disposed between the display area and the sensor hole area are defined. The display device further includes a plurality of scan wirings disposed on the substrate, connected to the pixels, extended along a first direction, and bypassing the sensor hole area in the sensor non-display area. Further, the plurality of scan wirings includes a first scan wiring and a second scan wiring disposed between the first scan wiring and the sensor hole area, and the second scan wiring has a larger width than the first scan wiring.

20 Claims, 14 Drawing Sheets

DISPLAY DEVICE

CROSS REFERENCE TO RELATED APPLICATION

The present application claims priority to Korean Patent Application No. 10-2022-0176533, filed in the Republic of Korea on Dec. 16, 2022, the entire contents of which is hereby expressly incorporated by reference into the present application.

BACKGROUND

Field

The disclosure relates to a display device.

Discussion of the Related Art

An organic light-emitting display device includes organic light-emitting diodes including hole injection electrodes, organic light-emitting layers, and electron injection electrodes. Each organic light-emitting diode emits light based on the energy generated when an exciton generated by a combination of an electron and a hole in the organic light-emitting layer falls from an excited state to a ground state, and the organic light-emitting display device displays a predetermined image based on such light emission.

The organic light-emitting display device has self-luminance characteristics, and is decreased in thickness and weight because a light source is not separately needed, unlike a liquid crystal display device. Further, the organic light-emitting display device has attracted attention as the next-generation display device with high-quality characteristics such as low power consumption, high brightness, and quick response speed.

Meanwhile, the organic light-emitting display device uses a process of encapsulating pixels with a glass substrate or the like to protect the pixels. However, due to the thickness and weight of the glass substrate, technologies are currently being developed to form a thin film encapsulation (TFE) layer by alternately stacking inorganic films and organic films as one or more layers.

SUMMARY OF THE DISCLOSURE

An aspect of the disclosure is to provide a display device in which parasitic capacitance formed between a scan wiring and a data wiring bypassing a sensor hole is minimized.

The problems and other limitations to be solved or addressed by the disclosure are not limited to those mentioned above, and other technical problems and limitations not mentioned will become apparent to those skilled in the art from the following description.

According to an embodiment of the disclosure, a display device includes a substrate where a display area including a plurality of pixels, a sensor hole area disposed in the display area, and a sensor non-display area disposed between the display area and the sensor hole area are defined; and a plurality of scan wirings disposed on the substrate, connected to the pixels, extended along a first direction, and bypassing the sensor hole area in the sensor non-display area, wherein the plurality of scan wirings includes a first scan wiring, and a second scan wiring disposed between the first scan wiring and the sensor hole area, and the second scan wiring has a larger width than the first scan wiring.

According to another embodiment of the disclosure, a display device includes a substrate where a display area including a plurality of pixels, a sensor hole area disposed in the display area, and a sensor non-display area disposed between the display area and the sensor hole area are defined; a first conductive layer including a scan wiring disposed on the substrate, connected to the pixel, extended along a first direction, and bypassing the sensor hole area in the sensor non-display area; and a second conductive layer disposed on the first conductive layer and including a data wiring disposed on the substrate, connected to the pixels, extended along a second direction intersecting the first direction, and bypassing the sensor hole area in the sensor non-display area, wherein the scan wiring and the data wiring includes a plurality of scan wirings and a plurality of data wirings, respectively, and a bypassing portion of the plurality of scan wirings with respect to the sensor hole area and a bypassing portion of the plurality of data wirings with respect to the sensor hole area are disposed to alternate with each other on a plane.

Details of other embodiments are included in the detailed description and the accompanying drawings.

By the display device according to embodiments of the present disclosure, the supply of high voltage power is improved in stability.

Further, parasitic capacitance formed between the data wirings and the scan wirings bypassing the sensor hole is minimized.

Further, resistance deviation between the data wirings or the scan wirings bypassing the sensor hole is minimized.

Effects according to embodiments of the present disclosure are not limited to the exemplary descriptions, and more various effects are involved in the disclosure.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
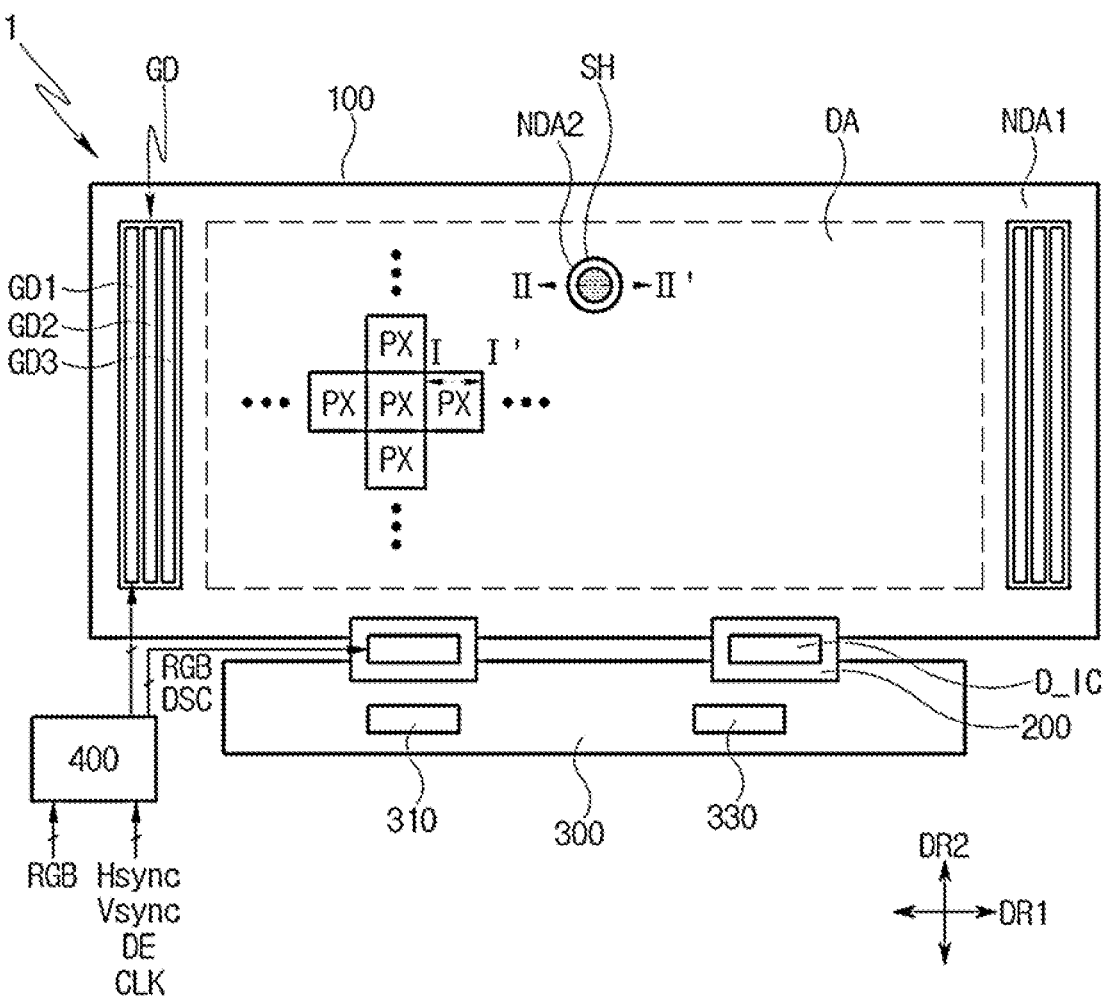
FIG. 1 is a plan view of a display device according to an embodiment of the disclosure.

Advantages and features of the disclosure and methods of accomplishing the same can be understood more readily by reference to the detailed description of embodiments that will be made hereinafter with reference to the accompanying drawings. The disclosure can, however, be embodied in many different forms and should not be construed as being limited to the exemplary embodiments set forth herein; rather, these exemplary embodiments are provided so that the disclosure will be thorough and complete and will fully convey the concept of the invention to those skilled in the art, and the present invention will only be defined by the appended claims.

When an element or layer is referred to as being "on", "over" or "above" another element or layer, it includes cases where one element or layer is directly located on the other element or layer or still other element or layer is interposed between the two elements or layers. Throughout the specification, the same reference numerals refer to the same components. The shapes, sizes, proportions, angles, numbers, etc. illustrated in the accompanying drawings to describe the embodiments are merely illustrative, and the disclosure is not limited to those illustrated.

Although the terms "first", "second", and the like are used to describe various components, these components are not limited by these terms. These terms are merely used for distinguishing one component from the other components, and may not define order or sequence. Therefore, the first component mentioned hereinafter can be the second component in the technical sense of the disclosure.

The features of various embodiments of the disclosure can be partially or entirely combined or assembled in various technical manners of interlocking and interoperation, and each embodiment can be implemented independently or in combination with related embodiments.

Hereinafter, detailed embodiments will be described with reference to the accompanying drawings. All the components of each display device according to all embodiments of the disclosure are operatively coupled and configured.

FIG. 1 is a plan view of a display device according to an embodiment of the disclosure.

Referring to FIG. 1, the display device according to an embodiment of the disclosure can be an organic light-emitting display device, and can also be a liquid crystal display device, an inorganic light-emitting display device, etc., without limitation. Hereinafter, the organic light-emitting display device will be described as the display device according to an embodiment of the disclosure.

The organic light-emitting display device can include a display panel 100. The display panel 100 can include a display area DA, a first non-display area NDA1 positioned on the periphery of the display area DA, and a second non-display area NDA2 (or a sensor non-display area) surrounded by or adjacent to the display area DA. The display area DA, and the non-display areas NDA1 and NDA2 can be defined in a substrate 101 to be described later.

Meanwhile, the display panel 100 can further include a sensor hole SH (or a sensor hole area) surrounded by the second non-display area NDA2. The sensor hole SH can be completely surrounded by the second non-display area NDA2 on a plane. A sensor can be disposed in the sensor hole SH. The sensor can be a camera sensor, but can include various sensors in the art, such as an infrared sensor, without limitation. FIG. 1 illustrates a single sensor hole SH, but there can be a plurality of sensor holes SH without limitation.

The display area DA can include a plurality of pixels PX. The plurality of pixels PX can be arranged in a matrix array or in other configurations. The display area DA can be shaped like, but not limited to, a rectangle in which long sides are extended along a first direction DR1 and short sides are extended along a second direction DR2. The first and second directions DR1 and DR2 can be perpendicular with each other or substantially perpendicular with each other.

The first non-display area NDA1 can surround the display area DA on a plane. The first non-display area NDA1 can include a pad area. The pad area can be disposed on, but not limited to, a second end in the second direction DR2 of the display panel 100.

A chip-on-film (COF) 200 can be attached to the pad area. A driving chip D_IC (e.g., driver integrated circuit) can be mounted onto the chip-on-film 200. A printed circuit board 300 can be attached to the second end in the second direction DR2 of the chip-on-film 200. FIG. 1 illustrates that the driving chip D_IC is mounted onto the chip-on-film 200, but not limited thereto. Alternatively, the driving chip D_IC can be directly mounted onto the display panel 100. There can be a plurality of chip on films 200 arranged along the first direction DR1.

A power management integrated circuit (PMIC) 310, a controller 330, etc., can be mounted to the printed circuit board 300. The controller 330 can perform overall control functions related to the operations of the display panel 100, thereby controlling the operations of the driving chip D_IC and the gate driver GD. The PMIC 310 can supply various voltages or currents to the driving chip D_IC, the gate driver GD, etc., or control various voltages or currents to be supplied. The gate driver GD can be disposed, for example, on a first side in the first direction DR1 of the display area DA or on the first non-display area NDA1 at a second side in the first direction DR1, but not limited thereto.

The gate driver GD supplies a scan signal SC to a gate line GL based on a gate control signal GCS transmitted from a controller 330. The gate driver GD can be disposed at one side or opposite sides of the display panel 100 as a gate in panel (GIP) type.

The gate driver GD outputs gate signals to a plurality of gate lines SL1 and SL2 (see FIG. 2) in sequence under the control of the controller 400. The gate driver GD can shift the gate signal through a shift register, thereby sequentially supplying the signals to the gate lines SL1 and SL2 (see FIG. 2).

The gate signal can include a scan signal SC and an emission control signal EM in the organic light-emitting display device. The scan signal SC includes a scan pulse that swings between a gate on voltage VGL and a gate off voltage VGH. The emission control signal can include an emission control signal pulse that swings between a gate on voltage VEL and a gate off voltage VEH.

The scan pulse is synchronized with a data voltage and selects pixels of a line in which data will be written. The emission control signal defines the emission time of the pixels.

The gate driver GD can include an emission control signal driver GD1, a first scan driver GD2, and a second scan driver GD3.

The emission control signal driver GD1 outputs the emission control signal pulse in response to a start pulse and a shift clock from the controller 400, and sequentially shifts the emission control signal pulses in response to the shift clocks.

The first scan driver GD2 and the second scan driver GD3 outputs the scan pulse in response to the start pulse and the shift clock from the controller 400, and shifts the scan pulse according to the shift clock timing.

Referring to FIG. 1, the emission control signal driver GD1 can be disposed at the outermost side of the gate driver GD, but not limited thereto. However, the emission control signal driver GD1 according to an embodiment of the disclosure can be disposed between the first scan driver GD2 and the second scan driver GD3, or can be disposed between the display panel 100 and the first and second scan drivers GD2 and GD3.

Figure 2:
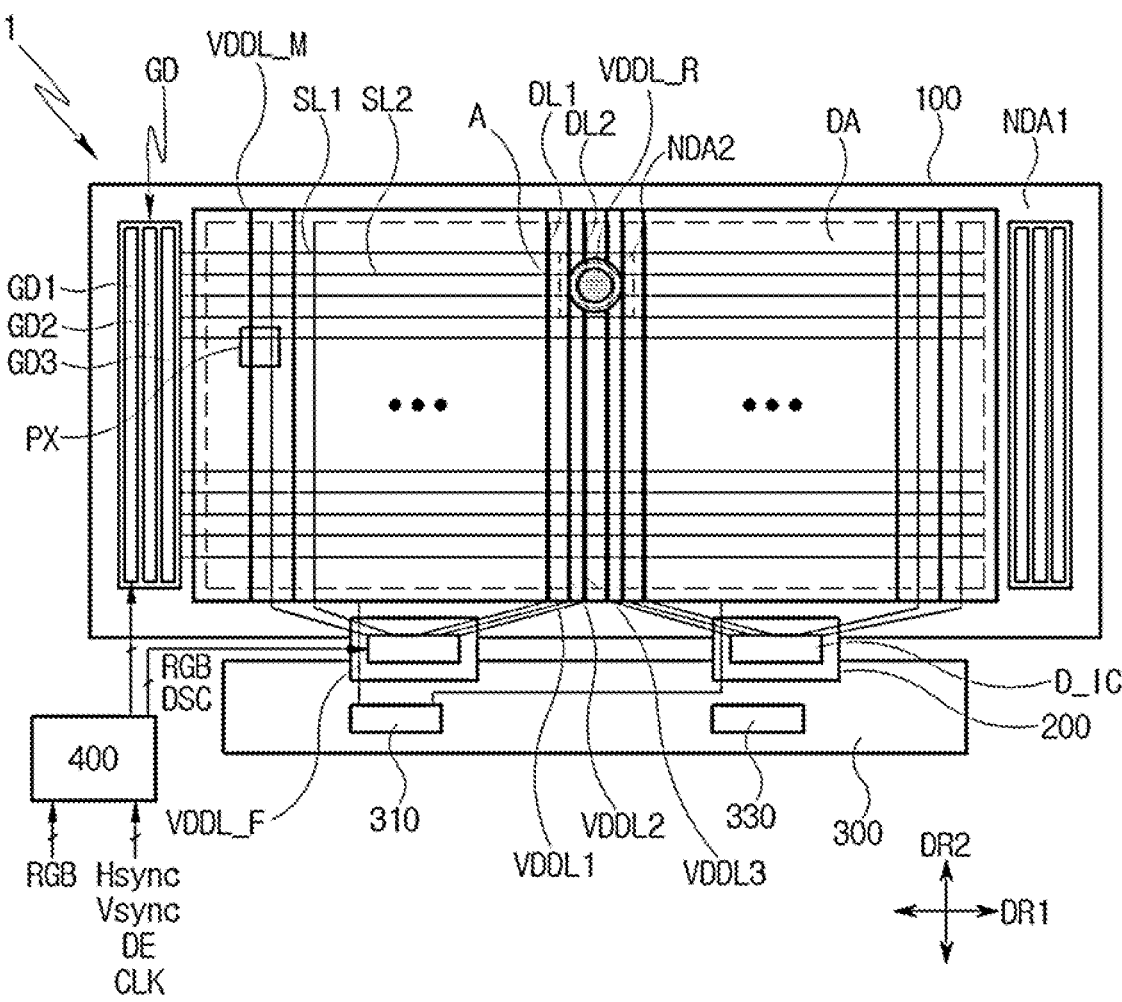
FIG. 2 is a plan view showing high-voltage power wirings, data wirings, and scan wirings of the display device of FIG. 1 in detail.

FIG. 2 is a plan view showing high-voltage power wirings, data wirings, and scan wirings of the display device of FIG. 1 in detail.

Referring to FIG. 2, the display panel 100 can include the high-voltage power wiring, the data wiring, and the scan wiring. Each of the high-voltage power wiring, the data wiring, and the scan wiring can be electrically connected to the pixel PX.

The scan wiring can be connected to the gate driver GD and extended along the first direction DR1. The plurality of scan wirings can be arranged being spaced apart from each other along the second direction DR2. For example, the plurality of scan wirings can include a first scan wiring SL1 and a second scan wiring SL2. The first scan wiring SL1 can be extended along the first direction DR1 without being bent, whereas the second scan wiring SL2 can be substantially extended along the first direction DR1 while bypassing the sensor hole SH in the second non-display area NDA2 on a plane. In the second non-display area NDA2, the second scan wiring SL2 can have a curved shape on a plane.

The data wiring can be connected to the driving chip D_IC and extended along the second direction DR2. For example, the plurality of data wirings can be arranged being spaced apart from each other along the first direction DR1. The plurality of data wirings can for example include a first data wiring DL1 and a second data wiring DL2. The first data wiring DL1 can be extended along the second direction DR2 without being bent, whereas the second data wiring DL2 can be substantially extended along the second direction DR2 while bypassing the sensor hole SH in the second non-display area NDA2 on a plane. In the second non-display area NDA2, the second data wiring DL2 can have a curved shaped on a plane.

Figure 3:
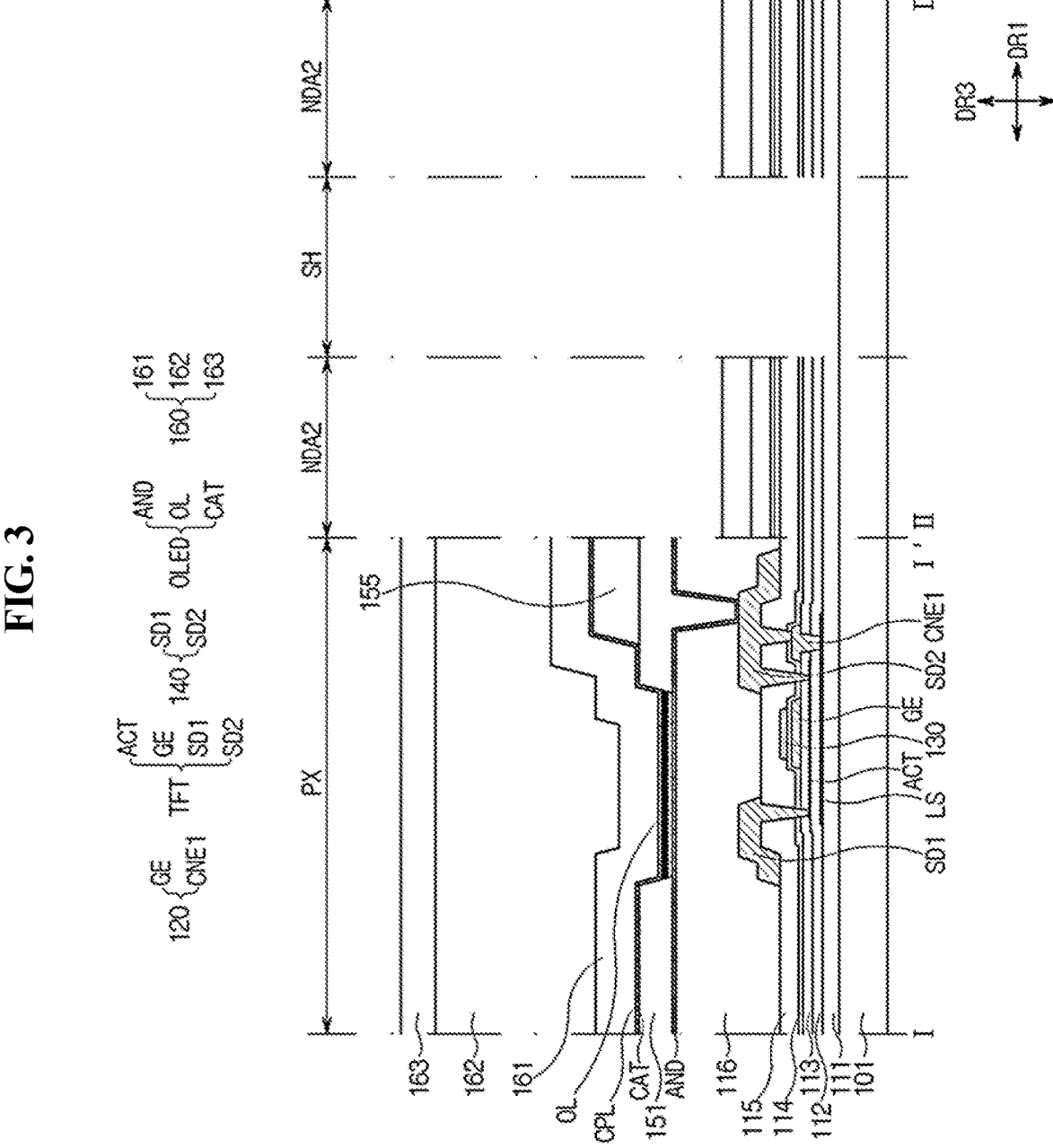
FIG. 3 is a cross-sectional view taken along lines I-I' and II-II' in FIG. 1.

The high-voltage power wiring can be connected to the pixel PX, and an organic light-emitting diode (OLED) (see FIG. 3) of the pixel PX can be electrically connected to an anode ANO (see FIG. 3).

The high-voltage power wiring can, as shown in FIG. 2, include a fan-out power wiring VDDL_F, a main power wiring VDDL_M, a first power wiring VDDL1, a second power wiring VDDL2, a third power wiring VDDL3, and a hole-surrounding power wiring VDDL_R. The fan-out power wiring VDDL_F can connect the PMIC 310 and the main power wiring VDDL_M. The fan-out power wiring VDDL_F can pass the chip-on-film 200. The fan-out power wiring VDDL_F can receive a high-voltage power signal from the PMIC 310 and transmit the signal to the main power wiring VDDL_M. The main power wiring VDDL_M can be disposed in a non-display area NDA. The main power wiring VDDL_M can surround the display area DA on a plane. The main power wiring VDDL_M can completely surround the display area DA on a plane. The power wirings VDDL1, VDDL2, VDDL3, and VDDL_R can connect the main power wiring VDDL_M at the first side in the second direction DR2 and the main power wiring VDDL_M at the second side in the second direction DR2. For example, the first power wiring VDDL1 can directly connect the main power wiring VDDL_M at the first side in the second direction DR2 and the main power wiring VDDL_M at the second side in the second direction DR2. The plurality of first power wirings VDDL1 can be extended along the second direction DR2. The plurality of first power wirings VDDL1 can be spaced apart from each other and arranged along the first direction DR1.

Like the first power wiring VDDL1, the second power wiring VDDL2 directly connects the main power wiring VDDL_M at the first side in the second direction DR2 and the main power wiring VDDL_M at the second side in the second direction DR2, and can be in direct contact with the adjacent hole-surrounding power wiring VDDL_R.

The third power wiring VDDL3 can be connected to the hole-surrounding power wiring VDDL_R at both the first end in the second direction DR2 and the second end in the second direction DR2.

The hole-surrounding power wiring VDDL_R can completely surround the sensor hole SH on a plane. The hole-surrounding power wiring VDDL_R can completely surround the second non-display area NDA2 on a plane, and be disposed in the display area DA.

FIG. 3 is a cross-sectional view taken along lines I-I' and II-II' in FIG. 1.

Referring to FIG. 3, the display panel 100 (see FIG. 1) can include the substrate 101, a barrier layer 111 on the substrate 101, a light shielding layer LS on the barrier layer 111, a buffer layer 112 on the light shielding layer LS, a semiconductor layer ACT on the buffer layer 112, a gate insulating layer 113 on the semiconductor layer ACT, a first conductive layer 120 on the gate insulating layer 113, a first interlayer insulating layer 114 on the first conductive layer 120, a second conductive layer 130 on the first interlayer insulating layer 114, a second interlayer insulating layer 115 on the second conductive layer 130, a third conductive layer 140 on the second interlayer insulating layer 115, a planarization layer 116 on the third conductive layer 140, an anode ANO on a planarization layer 116, a pixel defining layer 151 on the anode ANO, an organic layer OL on the pixel defining layer 151, a cathode CAT on the organic layer OL, a capping layer CPL on the cathode CAT, and an encapsulation layer 160 on the capping layer CPL.

The substrate 101 can support the layers disposed thereon. A base substrate can be disposed across the display area DA, the sensor hole SH, and the non-display areas NDA1 and NDA2. The substrate 101 can be made of a polymer resin or the like insulating material. As an example of the polymer material, there are polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or combinations thereof. The substrate 101 can be a flexible substrate capable of bending, folding, rolling, etc. The flexible substrate can, for example, be made of, but not limited to, polyimide (PI). The substrate 101 can also be a rigid substrate made of glass, quartz, etc.

The barrier layer 111 can be disposed on the substrate 101. The barrier layer 111 can be disposed across the display area DA and the non-display areas NDA1 and NDA2. The barrier layer 111 may not be disposed in the sensor hole SH. The barrier layer 111 can prevent diffusion of impurity ions and permeation of water or external air.

The barrier layer 111 can include a plurality of layers. In other words, the barrier layer 111 can include layers in which silicon nitride ($SiN_x$) and silicon oxide ($SiO_x$) are alternately stacked at least once.

The light shielding layer LS can be disposed on the barrier layer 111. The light shielding layer LS can overlap the semiconductor layer ACT in a thickness direction. The light shielding layer LS overlaps the semiconductor layer ACT from the bottom, thereby preventing light from entering the semiconductor layer ACT.

The buffer layer 112 can be disposed on the light shielding layer LS. The buffer layer 112 can be disposed across the display area DA and the non-display areas NDA1 and NDA2. The buffer layer 112 may not be disposed in the sensor hole SH. The buffer layer 112 can prevent the diffusion of impurity ions and permeation of water or external air.

The buffer layer 112 can include a plurality of layers. In other words, the buffer layer 112 can include layers in which silicon nitride ($SiN_x$) and silicon oxide ($SiO_x$) are alternately stacked at least once.

The semiconductor layer ACT can be disposed on the buffer layer 112. The semiconductor layer ACT can include polycrystalline silicon. The semiconductor layer ACT can include a channel area, a source area and a drain area. Polycrystalline silicon can be formed by crystalizing amorphous silicon. Examples of the crystallization can include, but are not limited to, rapid thermal annealing (RTA), solid phase crystallization (SPC), excimer laser annealing (ELA), metal induced crystallization (MIC), metal induced lateral crystallization (MILC), and sequential lateral solidification (SLS). In some embodiments, the semiconductor layer ACT can include an oxide semiconductor. The oxide semiconductor can include, for example, a binary compound (ABx), a ternary compound (ABxCy), or a quaternary compound (ABxCyDz), which contains indium, zinc, gallium, tin, titanium, aluminum, hafnium (Hf), zirconium (Zr), magnesium (Mg), etc.

The gate insulating layer 113 can be disposed on the semiconductor layer ACT. The gate insulating layer 113 is substantially disposed across the display area DA and the non-display areas NDA1 and NDA2, but not disposed in the sensor hole SH. The gate insulating layer 113 can include a gate insulating film having a gate insulating function. The gate insulating layer 113 can include a silicon compound, a metal oxide, etc. For example, the gate insulating layer 113 can include a silicon oxide, a silicon nitride, a silicon oxynitride, an aluminum oxide, a tantalum oxide, a hafnium oxide, a zirconium oxide, a titanium oxide, etc. These can be used alone or as combined with each other. Although it is illustrated that the gate insulating layer 113 is provided as a single layer, in some cases the gate insulating layer 113 can be provided as a multi-layered film where films of different materials are stacked.

The first conductive layer 120 can be disposed on the gate insulating layer 113.

According to an embodiment of the disclosure, the first conductive layer 120 can include a gate electrode GE, and a first electrode of a storage capacitor. Besides, the first conductive layer 120 can further include scan wirings SL1 and SL2 (see FIG. 2) through which scan signals are transmitted to the gate electrode GE. The gate electrode GE can be disposed to overlap the channel area of the semiconductor layer ACT. Meanwhile, the first conductive layer 120 can further include a first connection electrode CNE1 connected to the light shielding layer LS.

The gate electrode GE, and the first electrode of the storage capacitor can be made of the same material under the same process. For example, the first conductive layer 120 can contain one or more metals selected among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Although it is illustrated that the first conductive layer 120 is formed as the single layer, in some cases the first conductive layer 120 can be formed as the multi-layered film. In this case, the multi-layered film of the first conductive layer 120 can be formed as the film where different metals among the metals described above are stacked.

The first interlayer insulating layer 114 can be disposed on the first conductive layer 120. The first interlayer insulating layer 114 can be disposed across the display area DA and the non-display area NDA, but may not be disposed in the sensor hole SH.

The first interlayer insulating layer 114 can insulate the first conductive layer 120 and the second conductive layer 130. The first interlayer insulating layer 114 can be an interlayer insulating film.

The first interlayer insulating layer 114 can include an inorganic insulating material such as a silicon oxide, a silicon nitride, a silicon oxynitride, a hafnium oxide, an aluminum oxide, a titanium oxide, a tantalum oxide, or a zinc oxide, or an organic insulating material such as a polyacrylates resin, an epoxy resin, a phenolic resin, a polyamides resin, a polyimides rein, an unsaturated polyesters resin, a poly phenylenethers resin, a polyphenylenesulfides resin, or a benzocyclobutene (BCB). In the accompanying drawings, the first interlayer insulating layer 114 is illustrated as, but not limited to, the single layer. However, the first interlayer insulating layer 114 can be formed as a multi-layered film where films of different materials are stacked.

The second conductive layer 130 can be disposed on the first interlayer insulating layer 114. The second conductive layer 130 can include the second electrode of the storage capacitor. The second electrode can overlap the first electrode with the first interlayer insulating layer 114 therebetween. In other words, the first electrode and the second electrode can form a storage capacitor Cst that uses the first interlayer insulating layer 114 as a dielectric film. Besides, the second conductive layer 130 can include the high-voltage power wirings VDDL_F, VDDL_M, VDDL1, VDDL2, VDDL3, and VDDL_R. In other words, the high-voltage power wirings VDDL_F, VDDL_M, VDDL1, VDDL2, VDDL3, and VDDL_R can be formed as the second conductive layer 130.

The second conductive layer 130 can include one or more metals selected among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). According to an embodiment of the disclosure, the second conductive layer 130 can be made of the same material as the first conductive layer 120 described above.

Although the second conductive layer 130 is illustrated as a single layer, in some cases the second conductive layer 130 can be formed as the multi-layered film.

The second interlayer insulating layer 115 can be disposed on the second conductive layer 130. The second interlayer insulating layer 115 can insulate the second conductive layer 130 and the third conductive layer 140.

The second interlayer insulating layer 115 can include an inorganic insulating material such as a silicon oxide, a silicon nitride, a silicon oxynitride, a hafnium oxide, an aluminum oxide, a titanium oxide, a tantalum oxide, or a zinc oxide, or an organic insulating material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB).

The second interlayer insulating layer 115 can be disposed even in the non-display areas NDA1 and NDA2 while substantially covering the second conductive layer 130 of the display area DA. The second interlayer insulating layer 115 may not be disposed in the sensor hole SH.

The third conductive layer 140 can be disposed on the second interlayer insulating layer 115. According to an embodiment of the disclosure, the third conductive layer 140 can include a first source-drain electrode SD1 and a second source-drain electrode SD2. The first source-drain electrode SD1 can be connected to the source area of the semiconductor layer ACT, and the second source-drain electrode SD2 can be connected to the drain area of the semiconductor layer ACT. The second source-drain electrode SD2 can also be connected to the first connection electrode CNE1 of the first conductive layer 120. Besides, the third conductive layer 140 can further include the data wiring DL of FIG. 2.

The third conductive layer 140 can include one or more metals selected among aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). As shown in the accompanying drawings, the third conductive layer 140 can be a single layer. However, without limitation, the third conductive layer 140 can be a multi-layered film. For example, the third conductive layer 140 can be formed to have a stacked structure of Ti—Al—Ti, Mo—Al—Mo, Mo—AlGe—Mo, Ti—Cu or the like.

The planarization layer 116 can be disposed on the third conductive layer 140. The planarization layer 116 can include an organic insulating material such as a polyacrylates resin, an epoxy resin, a phenolic resin, a polyamides resin, a polyimides rein, an unsaturated polyesters resin, a poly phenylenethers resin, a polyphenylenesulfides resin, or benzocyclobutene (BCB).

The planarization layer 116 can be disposed in the display area DA, but not disposed in the second non-display area NDA2 and the sensor hole SH.

The anode ANO can be disposed on the planarization layer 116. The anode ANO can include a connection electrode CNE. The connection electrode CNE can penetrate the planarization layer 116 to connect with the foregoing second source-drain electrode SD2.

The anode ANO can include one or more metals selected from among aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). The anode ANO can be a single layer as shown in the accompanying drawings. However, without limitation, the anode ANO can be a multi-layered film. For example, the anode ANO can be formed to have a stacked structure of Ti/Al/Ti, Mo/Al/Mo, Mo/AlGe/Mo, Ti/Cu, etc.

The pixel defining layer 151 can be disposed on the anode ANO. The pixel defining layer 151 can include an opening through which the anode ANO is exposed. The pixel defining layer 151 can include the organic insulating material or the inorganic insulating material. According to an embodiment of the disclosure, the pixel defining layer 151 can include a photoresist, a polyimides resin, an acrylic-based resin, a silicon compound, a polyacrylates resin, or the like material.

The organic layer OL can be disposed on the anode ANO and inside the opening of the pixel defining layer 151. The organic layer OL is illustrated as disposed only inside the opening of the pixel defining layer 151, but not limited thereto. Alternatively, the organic layer OL can be disposed extending from the opening of the pixel defining layer 151 up to the top of the pixel defining layer 151.

The organic layer OL can include an organic light-emitting layer, a hole injection/transport layer, and an electron injection/transport layer.

The organic layer OL can be disposed on the display area DA.

The cathode CAT is disposed on the organic layer OL and the pixel defining layer 151. The cathode CAT can be a common electrode disposed across the plurality of pixels PX of the display area DA. The organic layer OL, the anode ANO, and the cathode CAT can form the organic light-emitting diode (OLED).

The encapsulation layer 160 can be disposed on the cathode CAT. The encapsulation layer 160 can cover the organic light-emitting diode (OLED). The encapsulation layer 160 can be a stacked film where an inorganic film and an organic film are alternately stacked. For example, the encapsulation layer 160 can include a first inorganic film 161, an organic film 162, and a second inorganic film 163 which are stacked in sequence. The first inorganic film 161, the organic film 162, and the second inorganic film 163 can be disposed throughout the display area DA, can also be disposed even in the second non-display area NDA2, but may not be disposed in the sensor hole SH.

As described above, no stacked structure other than the substrate 101 can be disposed above the sensor hole SH. However, without limitation, the barrier layer 111 can be disposed above the sensor hole SH.

Figure 4:
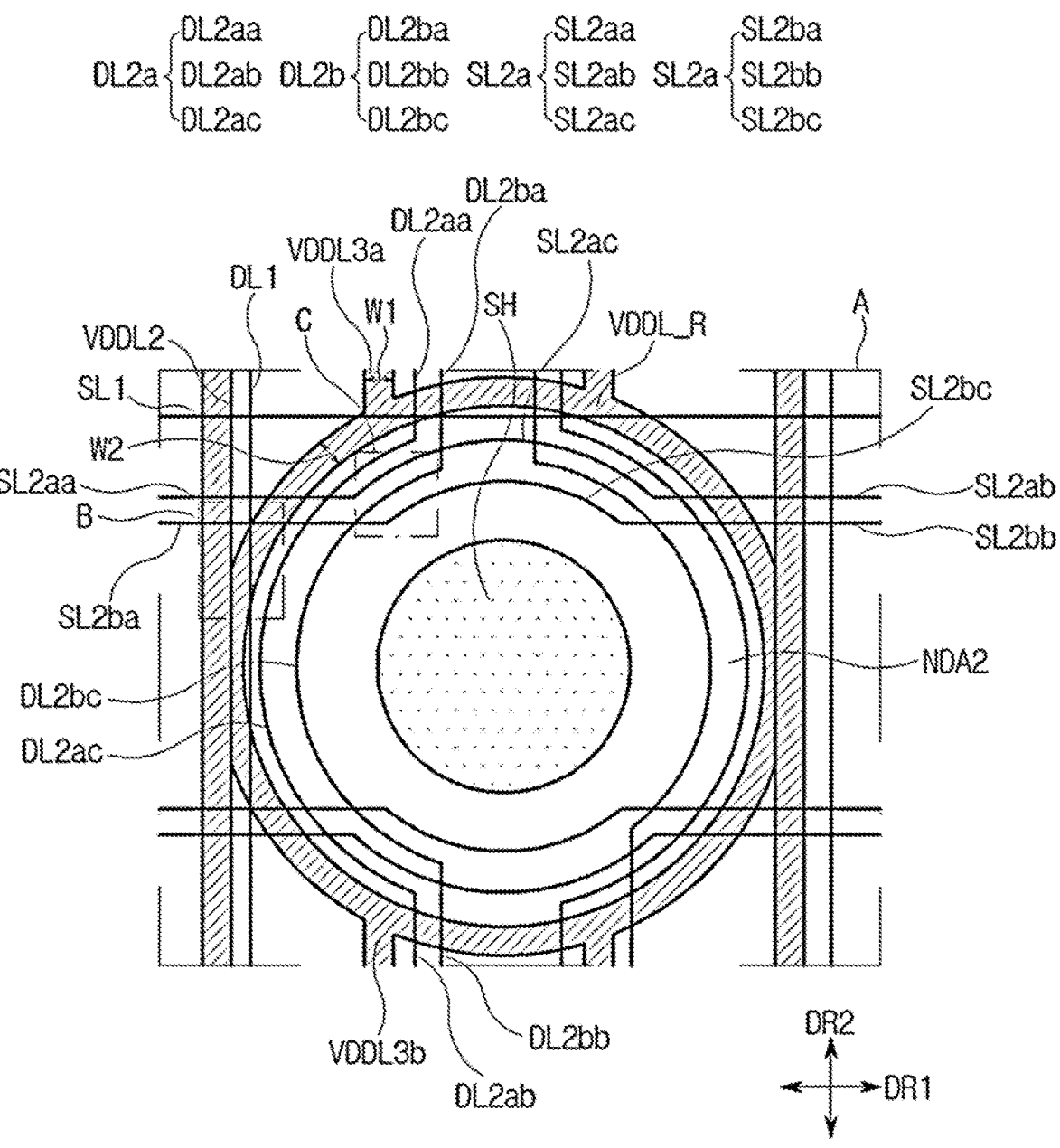
FIG. 4 is an enlarged plan view of an area A in FIG. 2.
Figure 5:
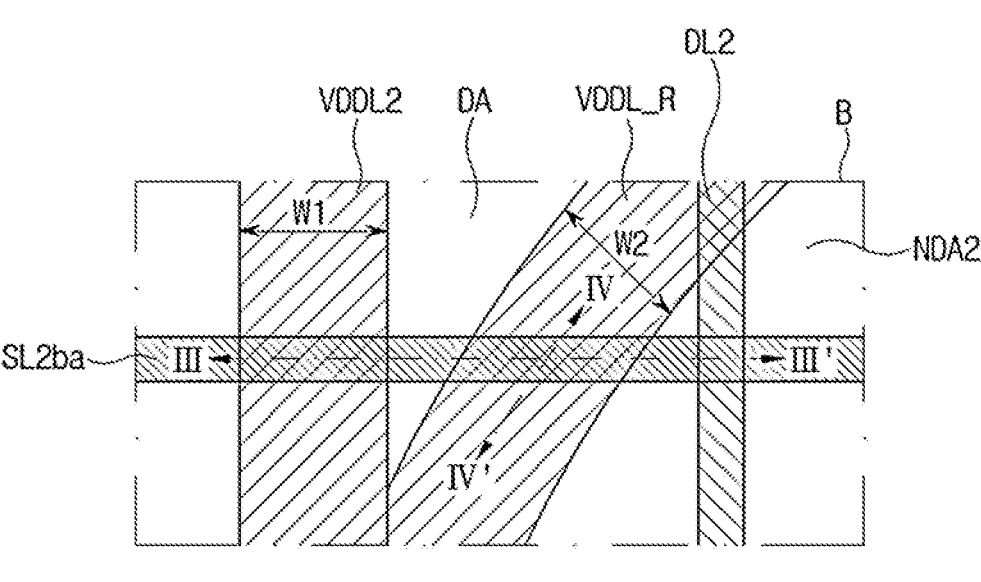
FIG. 5 is an enlarged plan view of an area B in FIG. 4.
Figure 6:
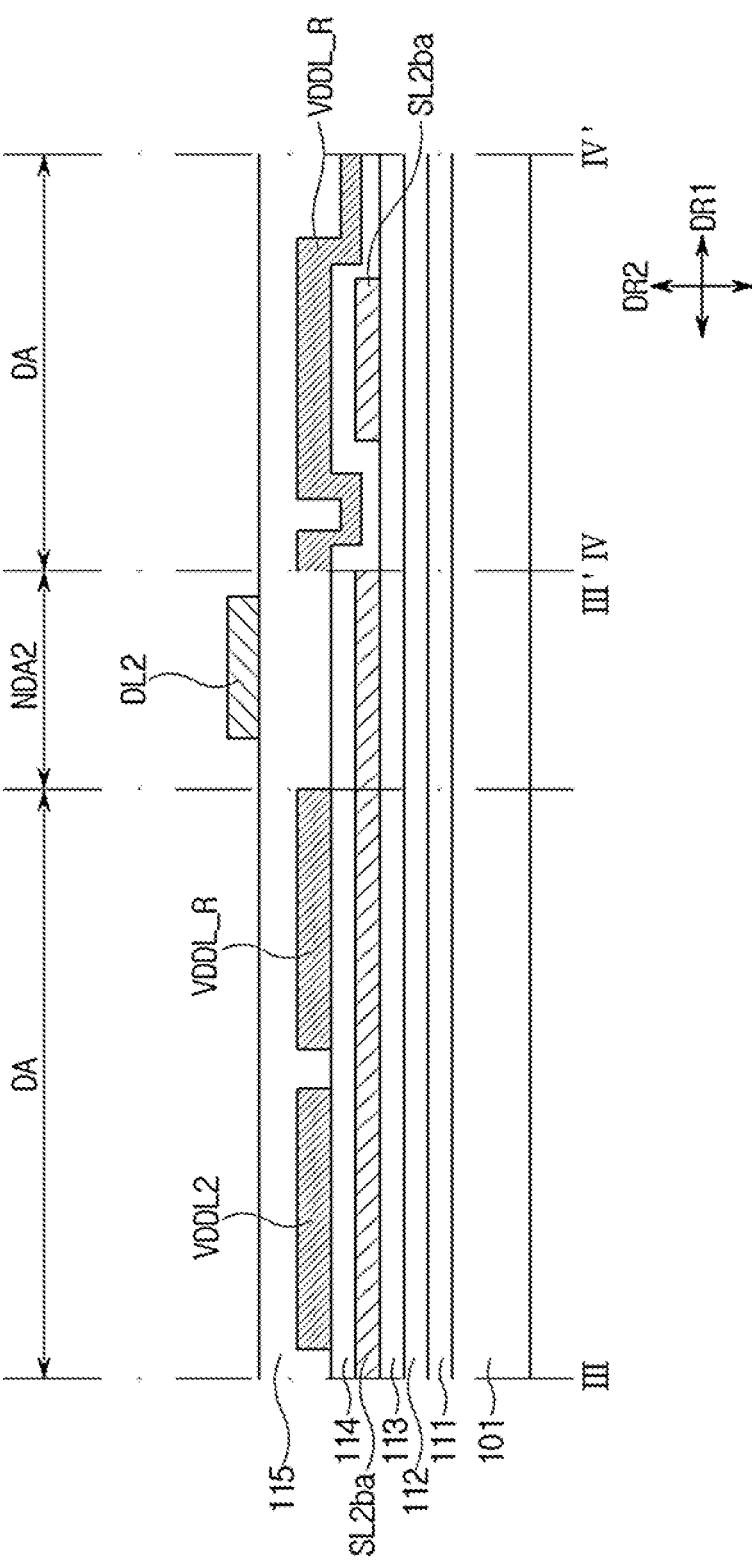
FIG. 6 is a cross-sectional view taken along lines III-III' and IV-IV' in FIG. 5.

FIG. 4 is an enlarged plan view of an area A in FIG. 2. FIG. 5 is an enlarged plan view of an area B in FIG. 4. FIG. 6 is a cross-sectional view taken along lines III-III' and IV-IV' in FIG. 5.

Referring to FIGS. 4 to 6, there can be a plurality of second scan wirings SL2 (see FIG. 2). The second scan wiring SL2 can include a 2-1th scan wiring SL2*a*, and a 2-2th scan wiring SL2*b* disposed between the 2-1th scan wiring SL2*a* and the sensor hole SH. The 2-1th scan wiring SL2*a* can include first scan wiring portions SL2*aa* and SL2*ab* extended along the first direction DR1, and a second scan wiring portion SL2*ac* connecting the first scan wiring portions SL2*aa* and SL2*ab*. The 2-2th scan wiring SL2*b* can include first scan wiring portions SL2*ba* and SL2*bb* extended along the first direction DR1, and a second scan wiring portion SL2*bc* connecting the first scan wiring portions SL2*ba* and SL2*bb*. Each of the second scan wiring portions SL2*ac* and SL2*bc* can bypass the sensor hole SH on a plane. For example, each of the second scan wiring portions SL2*ac* and SL2*bc* can have a curved shape on a plane, but is not limited thereto. On a plane, the second scan wiring portion SL2*bc* of the 2-2th scan wiring SL2*b* can be disposed between the second scan wiring portion SL2*ac* of the 2-1th scan wiring SL2*a* and the sensor hole SH. In other words, a spacing distance between the second scan wiring portion SL2*bc* of the 2-2th scan wiring SL2*b* and the sensor hole SH can be shorter than a spacing distance between the second scan wiring portion SL2*ac* of the 2-1th scan wiring SL2*a* and the sensor hole SH.

According to an embodiment of the disclosure, the length of the 2-2th scan wiring SL2*b* closer to the sensor hole SH than the 2-1th scan wiring SL2*a* on a plane can be larger than the length of the 2-1th scan wiring SL2*a*.

The second scan wiring SL2 (see FIG. 2) can intersect the second power wiring VDDL2 and the hole-surrounding power wiring VDDL_R on a plane, and can also intersect the first and second data wirings DL1 and DL2 (see FIG. 2).

There can be a plurality of second data wirings DL2 (see FIG. 2). The second data wiring DL2 can include a 2-1th data wiring DL2*a*, and a 2-2th data wiring DL2*b* disposed between the 2-1th data wiring DL2*a* and the sensor hole SH. The 2-1th data wiring DL2*a* can include first data wiring portions DL2*aa* and DL2*ab* extended along the second direction DR2, and a second data wiring portion DL2*ac* connecting the first data wiring portions DL2*aa* and DL2*ab*. The 2-2th data wiring DL2*b* can include first data wiring portions DL2*ba* and DL2*bb* extended along the second direction DR2, and a second data wiring portion DL2*bc* connecting the first data wiring portions DL2*ba* and DL2*bb*. Each of the second data wiring portion DL2*ac* and DL2*bc* can bypass the sensor hole SH on a plane. For example, each of the second data wiring portions DL2*ac* and DL2*bc* can have a curved shape on a plane, but is not limited thereto. On a plane, the second data wiring portion DL2*bc* of the 2-2th data wiring DL2*b* can be disposed between the second data wiring portion DL2*ac* of the 2-1th data wiring DL2*a* and the sensor hole SH. In other words, a spacing distance between the second data wiring portion DL2*bc* of the 2-2th data wiring DL2*b* and the sensor hole SH can be shorter than a spacing distance between the second data wiring portion DL2*ac* of the 2-1th data wiring DL2*a* and the sensor hole SH.

According to an embodiment of the disclosure, the length of the 2-2th data wiring DL2*b* closer to the sensor hole SH than the 2-1th data wiring DL2*a* on a plane can be larger than the length of the 2-1th data wiring DL2*a*.

The first data wiring DL1 can intersect the hole-surrounding power wiring VDDL_R and the second scan wiring SL2 on a plane.

The second data wiring DL2 can intersect the second scan wiring SL2 (see FIG. 2) on a plane.

The third power wiring VDDL3 can include a 3-1th power wiring portion VDDL3*a*, and a 3-2th power wiring portion VDDL3*b*. Each of the 3-1th power wiring portion VDDL3*a* and the 3-2th power wiring portion VDDL3*b* can be extended along the second direction DR2. The 3-1th power wiring portion VDDL3*a* can be connected to the first end of the hole-surrounding power wiring VDDL_R in the second direction DR2, and the 3-2th power wiring portion VDDL3*b* can be connected to the second end of the hole-surrounding power wiring VDDL_R in the second direction DR2. In other words, a hole-surrounding power wiring portion VDDL_R can be disposed between the 3-1th power wiring portion VDDL3*a* and the 3-2th power wiring portion VDDL3*b*.

Conventionally, the hole-surrounding power wiring portion VDDL_R is not disposed around the sensor hole SH, and thus the 3-1th power wiring portion VDDL3*a* and the 3-2th power wiring portion VDDL3*b* are physically spaced from each other. The level of high voltage power supplied to the first or second power wirings VDDL1 and VDDL2 formed as a single body can be significantly different from the level of high voltage power supplied to each of the 3-1th power wiring portion VDDL3*a* and the 3-2th power wiring portion VDDL3*b*. In this case, the brightness level of light emitted in the pixels PX (see FIG. 2) connected to the 3-1th power wiring portion VDDL3*a* and the pixels PX (see FIG. 2) connected to the 3-2th power wiring portion VDDL3*b* can be significantly different from the brightness level of light emitted in the pixels PX (see FIG. 2) connected to the first or second power wirings VDDL1 or VDDL2, thereby causing nonuniformity in brightness between the pixels PX in the display area DA.

On the other hand, in the case of the display device 1 according to an embodiment of the disclosure, the hole-surrounding power wiring portion VDDL_R completely surrounding the sensor hole SH on a plane is further disposed between the 3-1th power wiring portion VDDL3*a* and the 3-2th power wiring portion VDDL3*b* spaced apart from each other with the sensor hole SH therebetween, the 3-1th power wiring portion VDDL3*a* is connected to the first end of the hole-surrounding power wiring VDDL_R in the second direction DR2, and the 3-2th power wiring portion VDDL3*b* is connected to the second end of the hole-surrounding power wiring VDDL_R in the second direction DR2, thereby preventing the nonuniformity in brightness between the pixels within the display area DA.

As shown in FIG. 6, the first scan wiring portions SL2*ba* of the 2-2th scan wiring SL2*b* can be disposed in the first conductive layer 120 (see FIG. 3), the third power wiring VDDL2 and the hole-surrounding power wiring VDDL_R can be disposed in the second conductive layer 130 (see FIG. 3), the hole-surrounding power wiring VDDL_R can overlap the first scan wiring portion SL2*ba*, the first data wiring DL1 can be disposed on the third conductive layer 140 (see FIG. 3) and overlap the first scan wiring portion SL2*ba*.

In the display device 1 according to an embodiment of the disclosure, the width W2 of the hole-surrounding power wiring portion VDDL_R can be the same as the width W1 of the first or second power wirings VDDL1 or VDDL2 and the width W1 of the 3-1th power wiring portion VDDL3*a* and the 3-2th power wiring portion VDDL3*b*.

Figure 7:
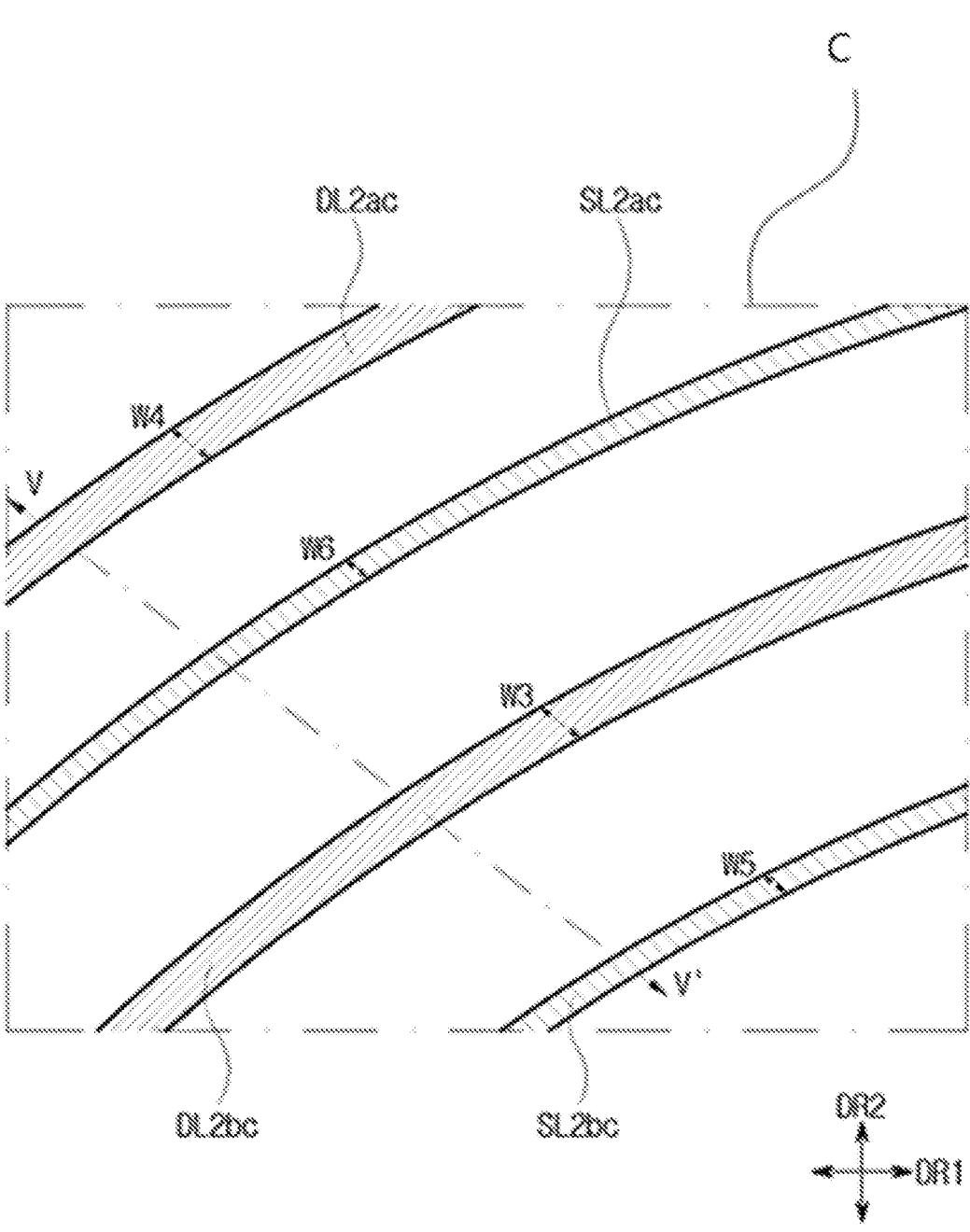
FIG. 7 is an enlarged plan view of an area C in FIG. 4.
Figure 8:
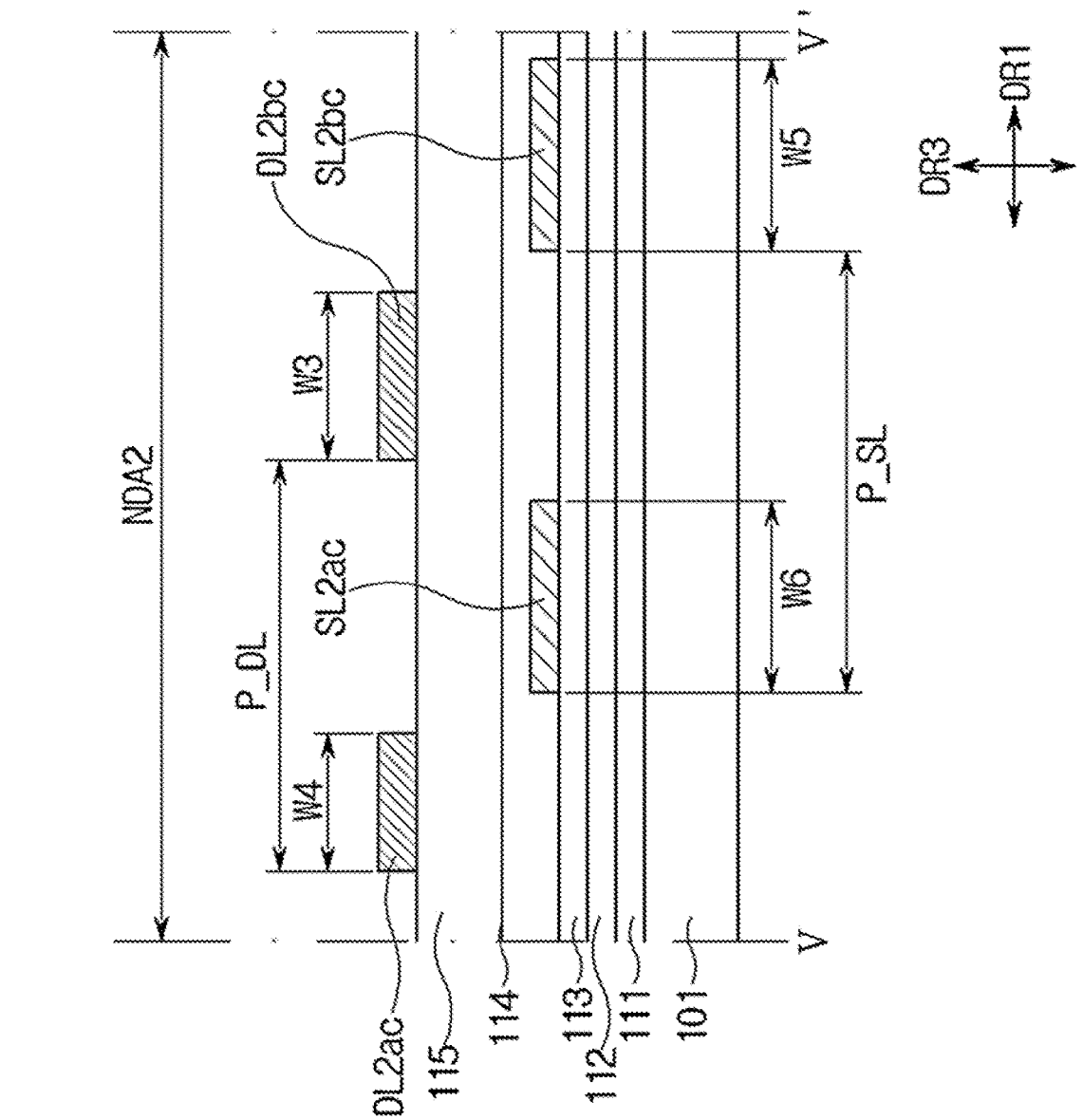
FIG. 8 is a cross-sectional view taken along line V-V' in FIG. 7.

FIG. 7 is an enlarged plan view of an area C in FIG. 4. FIG. 8 is a cross-sectional view taken along line V-V' in FIG. 7.

Referring to FIGS. 7 and 8 along with FIGS. 4 and 5, as described above with reference to FIG. 4, according to an embodiment of the disclosure, the length of the 2-2th scan wiring SL2*b* closer to the sensor hole SH than the 2-1th scan wiring SL2*a* on a plane can be larger than the length of the 2-1th scan wiring SL2*a*, and the length of the 2-2th data wiring DL2*b* closer to the sensor hole SH than the 2-1th data wiring DL2*a* on a plane can be larger than the length of the 2-1th data wiring DL2*a*.

In other words, the scan wirings SL2*a* and SL2*b* bypassing the sensor hole SH are different in length with respect to the sensor hole SH, thereby causing a difference in brightness between pixels PX (see FIG. 2) respectively connected to the scan wirings SL2*a* and SL2*b* during an imaging test of the display device 1. Likewise, the data wirings DL2*a* and DL2*b* bypassing the sensor hole SH are different in length, thereby causing a difference in brightness between pixels PX (see FIG. 2) respectively connected to the data wirings DL2*a* and DL2*b* during an imaging test of the display device 1.

To address this issue in the display device 1 according to an embodiment of the disclosure, the wirings bypassing the sensor hole SH can be designed to be different in width in consideration of the spacing distance from the sensor hole SH. In other words, the wirings bypassing the sensor hole SH are increased in overall length as their spacing distances from the sensor hole SH become shorter. Therefore, the wiring can be increased in width in consideration of the increased length of the wiring. FIGS. 7 and 8 illustrate that the wirings bypassing the sensor hole SH include two scan wirings and two data wirings, but are not limited thereto. Alternatively, there can be three or more scan wirings and three or more data wirings bypassing the sensor hole SH. Even in this case, the wirings bypassing the sensor hole SH are increased in overall length as their spacing distances from the sensor hole SH become shorter, and thus the width of the wiring is increased in consideration of the increased length of the wiring.

In more detail, the second scan wiring portion SL2$ac$ of the 2-1th scan wiring SL2$a$ can have a sixth width W6, and the second scan wiring portion SL2$bc$ of the 2-2th scan wiring SL2$b$ can have a fifth width W5. FIGS. 7 and 8 illustrate only the widths W6 and W5 of the second scan wiring portions SL2$ac$ and SL2$bc$ of the scan wirings SL2$a$ and SL2$b$, but the widths W6 and W5 of the second scan wiring portions SL2$ac$ and SL2$bc$ can be the same as the widths of the first scan wiring portions of the scan wirings SL2$a$ and SL2$b$, respectively.

The second data wiring portion DL2$ac$ of the 2-1th data wiring DL2$a$ can have a fourth width W4, and the second data wiring portion DL2$bc$ of the 2-2th data wiring DL2$b$ can have a third width W3. FIGS. 7 and 8 illustrate only the widths W4 and W3 of the second data wiring portion DL2$ac$ and DL2$bc$ of the data wirings DL2$a$ and DL2$b$, but the widths W4 and W3 of the second scan wiring portions DL2$ac$ and DL2$bc$ can be the same as the widths of the first data wiring portions of the data wirings DL2$a$ and DL2$b$, respectively.

Because the 2-2th scan wiring SL2$b$ is longer than the 2-1th scan wiring SL2$a$, the fifth width W5 of the 2-2th scan wiring SL2$b$ can be larger than the sixth width W6 of the 2-1th scan wiring SL2$a$. Likewise, the 2-2th data wiring DL2$b$ is longer than the 2-1th data wiring DL2$a$, the third width W3 of the 2-2th data wiring DL2$b$ can be larger than the fourth width W4 of the 2-1th data wiring DL2$a$.

Meanwhile, in the display device 1 according to an embodiment of the disclosure, as described above, the wirings bypassing the sensor hole SH are increased in overall length as the spacing distances from the sensor hole SH become shorter. Therefore, the width of the wiring is increased in consideration of the increased length of the wiring, while the second scan wiring portions SL2$ac$ and SL2$bc$ of the scan wirings SL2$a$ and SL2$b$ and the second data wiring portions DL2$ac$ and DL2$bc$ of the data wirings DL2$a$ and DL2$b$ are disposed not to overlap with each other. In other words, as shown in FIGS. 7 and 8, the second data wiring portion DL2$bc$ can be disposed between the second scan wiring portions SL2$ac$ and SL2$bc$, and the second scan wiring portion SL2$ac$ can be disposed between the second data wiring portion DL2$ac$ and DL2$bc$. In other words, the second scan wiring portions SL2$ac$ and SL2$bc$ and the second data wiring portion DL2$bc$ can be disposed to alternate with each other with respect to the sensor hole SH on a plane, but not overlap at all with each other in a thickness the direction. Thus, there is an advantage of preventing parasitic capacitance from being formed between the second scan wiring portions SL2$ac$ and SL2$bc$ and the second data wiring portions DL2$bc$.

Below, other embodiments of the display device 1 according to an embodiment of the disclosure will be described.

Figure 9:
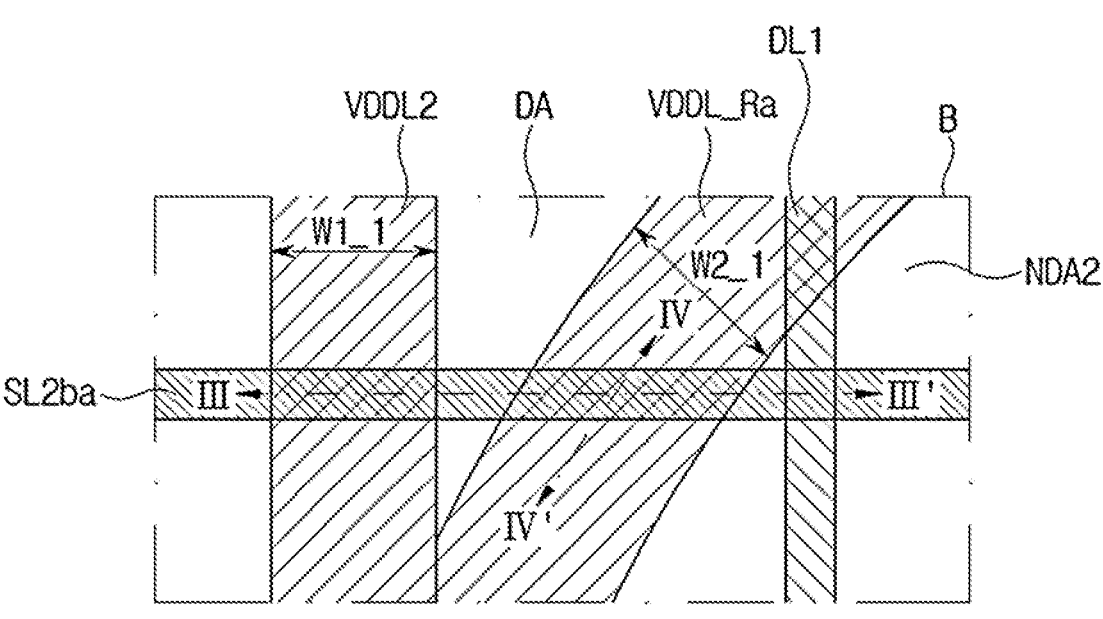
FIG. 9 is a plan view of a display device according to another embodiment of the disclosure.
Figure 9:

FIG. 9 is a plan view of a display device according to another embodiment of the disclosure.

Referring to FIG. 9, the display device of FIG. 9 is different from that of FIG. 5 in that the width W2_1 of the hole-surrounding power wiring portion VDDL_R is different from the width W1_1 of the first or second power wiring VDDL1 or VDDL2 or the width W1_1 of the 3-1th power wiring portion VDDL3$a$ and the 3-2th power wiring portion VDDL3$b$.

In more detail, the width W2_1 of the hole-surrounding power wiring portion VDDL_R can be larger than the width W1_1 of the first or second power wiring VDDL1 or VDDL2 or the width W1_1 of the 3-1th power wiring portion VDDL3$a$ and the 3-2th power wiring portion VDDL3$b$.

According to an embodiment of the disclosure, the length of wiring leading to the 3-1th power wiring portion VDDL3$a$, the hole-surrounding power wiring portion VDDL_R, and the 3-2th power wiring portion VDDL3$b$ can be longer than the length of the first and second power wiring VDDL1 and VDDL2. Because the hole-surrounding power wiring portion VDDL_R completely surrounds the sensor hole SH, the length of the wiring leading to the 3-1th power wiring portion VDDL3$a$, the hole-surrounding power wiring VDDL_R, and the 3-2th power wiring portion VDDL3$b$ can be much longer than the length of the wiring of the first or second power wiring VDDL1 or VDDL2.

In this case, there can be a difference in internal resistance between the wiring leading to the 3-1th power wiring portion VDDL3$a$, the hole-surrounding power wiring VDDL_R, and the 3-2th power wiring portion VDDL3$b$ and the wiring of the first or second power wiring VDDL1 or VDDL2. Such a difference in internal resistance between the power wirings can cause nonuniformity in brightness between the pixels PX within the display area DA.

However, in the display device 1 according to an embodiment of the disclosure, the width W2_1 of the hole-surrounding power wiring portion VDDL_R is designed to be larger than the width W1_1 of the first or second power wiring VDDL1 or VDDL2 or the width W1_1 of the 3-1th power wiring portion VDDL3$a$ and the 3-2th power wiring portion VDDL3$b$, thereby reducing a difference in internal resistance between the wiring leading to the 3-1th power wiring portion VDDL3$a$, the hole-surrounding power wiring VDDL_R, and the 3-2th power wiring portion VDDL3$b$ and the wiring of the first or second power wiring VDDL1 or VDDL2. Thus, there is an advantage of preventing nonuniformity in brightness between the pixels PX within the display area DA.

Figure 10:
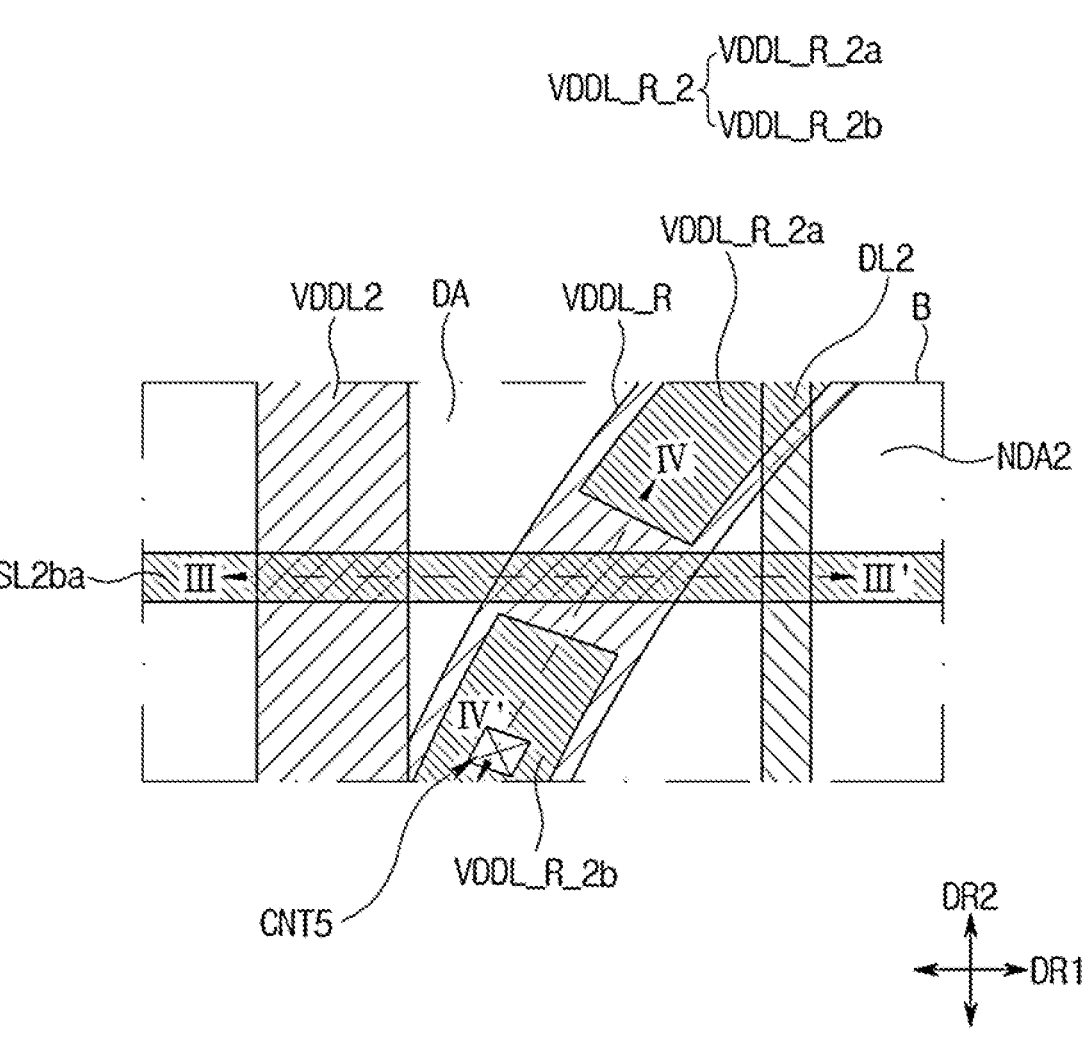
FIG. 10 is a plan view of a display device according to still another embodiment of the disclosure.
Figure 11:
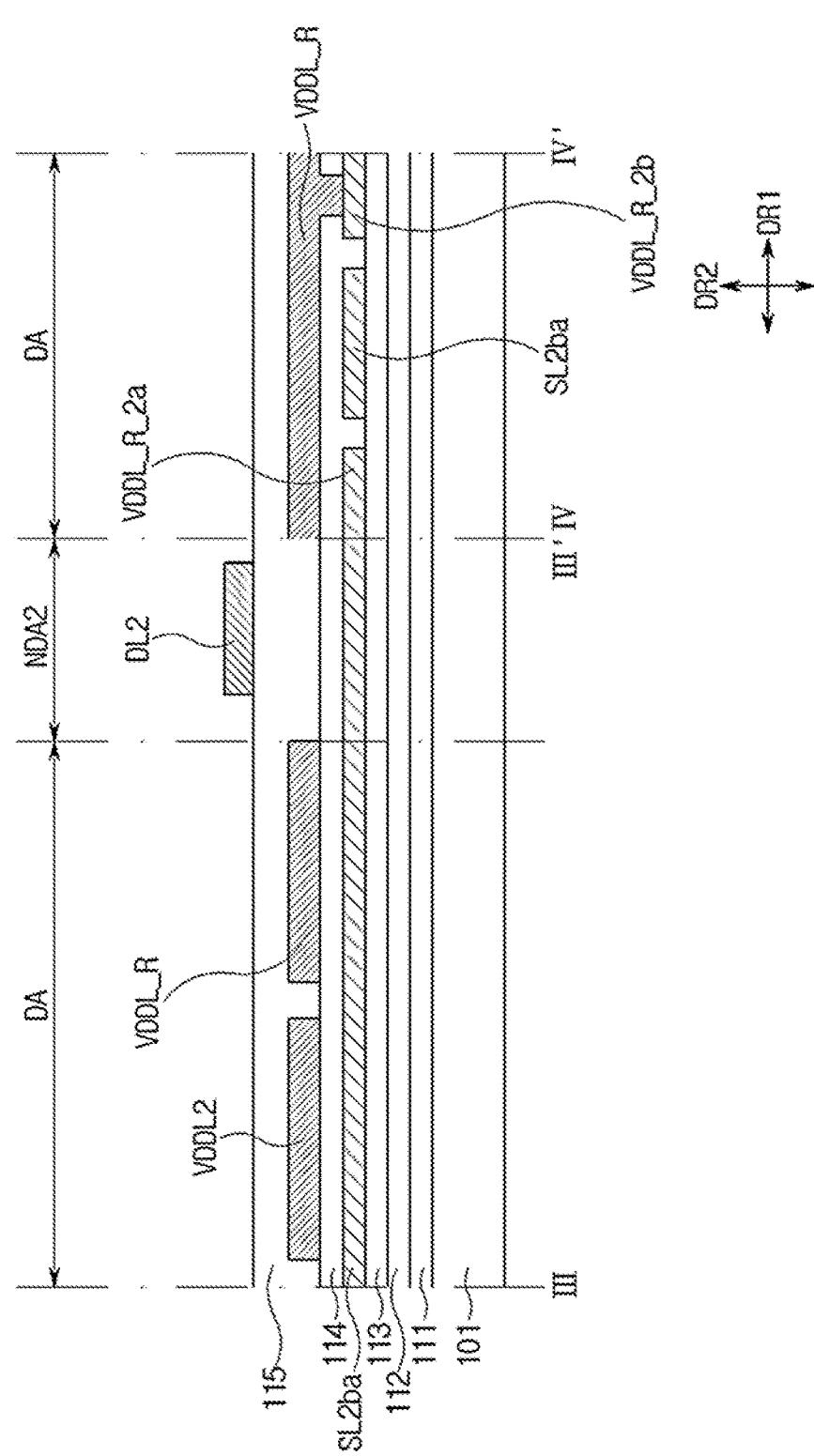
FIG. 11 is a cross-sectional view taken along lines III-III' and IV-IV' in FIG. 10.

FIG. 10 is a plan view of a display device according to still another embodiment of the disclosure. FIG. 11 is a cross-sectional view taken along lines III-III' and IV-IV' in FIG. 10.

The display device according to this embodiment of the disclosure shown in FIGS. 10 and 11 is different from that shown in FIGS. 5 and 6 in that the hole-surrounding power wiring is formed by two or more layers.

In more detail, referring to FIG. 10, the hole-surrounding power wiring according to an embodiment of the disclosure can include a first hole-surrounding power wiring layer VDDL_R and a second hole-surrounding power wiring layer VDDL_R_2. The first hole-surrounding power wiring layer VDDL_R has the same structure as the hole-surrounding power wiring VDDL_R of FIGS. 5 and 6, and thus repetitive descriptions will be avoided or minimal.

The second hole-surrounding power wiring layer VDDL_R_2 can include a 2-1th hole-surrounding power wiring portion VDDL_R_2$a$, and a 2-2th hole-surrounding power wiring portion VDDL_R_2$b$. The 2-1th hole-surrounding power wiring portion VDDL_R_2a can be positioned at a first side of the second scan wiring SL2 in the second direction DR2, and the 2-2th hole-surrounding power wiring portion VDDL_R_2b can be positioned at a second side of the second scan wiring SL2 in the second direction DR2. The 2-1th hole-surrounding power wiring portion VDDL_R_2a and the 2-2th hole-surrounding power wiring portion VDDL_R_2b can be disposed being spaced apart from each other with the second scan wiring SL2 therebetween on a plane. The 2-1th hole-surrounding power wiring portion VDDL_R_2a and the 2-2th hole-surrounding power wiring portion VDDL_R_2b can be disposed in the same layer as the second scan wiring SL2.

The 2-1th hole-surrounding power wiring portion VDDL_R_2a or the 2-2th hole-surrounding power wiring portion VDDL_R_2b can be connected through the first hole-surrounding power wiring layer VDDL_R and a fifth contact hole CNT5. The fifth contact hole CNT5 can be formed penetrating the first interlayer insulating layer 114.

According to an embodiment of the disclosure, the hole-surrounding power wiring includes the first hole-surrounding power wiring layer VDDL_R and the second hole-surrounding power wiring layer VDDL_R_2 disposed in different layers, thereby having an advantage of lowering the resistance of the hole-surrounding power wiring.

Figure 12:
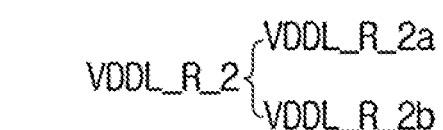
FIG. 12 is a plan view of a display device according to still another embodiment of the disclosure.
Figure 12:
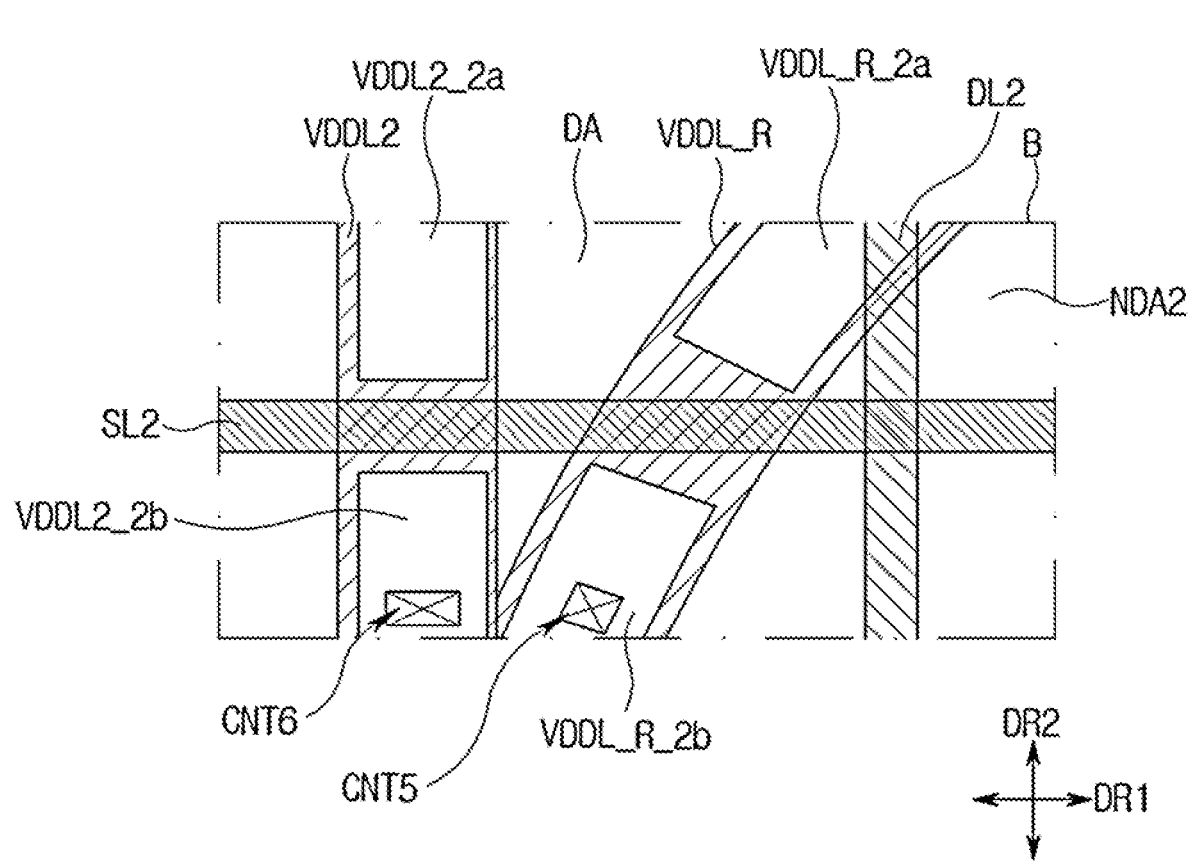

FIG. 12 is a plan view of a display device according to still another embodiment of the disclosure.

The display device according to this embodiment shown in FIG. 12 is different from that shown in FIGS. 10 and 11 in that the second power wiring includes two or more layers.

In more detail, referring to FIG. 12, the second power wiring according to an embodiment of the disclosure can include a first power wiring layer VDDL2 and a second power wiring layer VDDL2_2. The first power wiring layer VDDL2 has the same structure as the second power wiring VDDL2 of FIG. 10, and thus repetitive descriptions thereof will be avoided or minimal.

The second power wiring layer VDDL2_2 can include a 2-1th power wiring portion VDDL2_2a, and a 2-2th power wiring portion VDDL2_2b. The 2-1th power wiring portion VDDL2_2a can be positioned at a first side of the second scan wiring SL2 in the second direction DR2, and the 2-2th power wiring portion VDDL2_2b can be positioned at a second side of the second scan wiring SL2 in the second direction DR2. The 2-1th power wiring portion VDDL2_2a and the 2-2th power wiring portion VDDL2_2b can be disposed being spaced apart from each other with the second scan wiring SL2 therebetween on a plane. The 2-1th power wiring portion VDDL2_2a and the 2-2th power wiring portion VDDL2_2b can be disposed in the same layer as the second scan wiring SL2.

The 2-1th power wiring portion VDDL2_2a or the 2-2th power wiring portion VDDL2_2b can be connected to the first power wiring layer VDDL2 through a sixth contact hole CNT6. The sixth contact hole CNT6 can be formed penetrating the first interlayer insulating layer 114.

According to this embodiment of the disclosure, the second power wiring includes the first power wiring layer VDDL2 and the second power wiring layer VDDL2_2 disposed in different layers, thereby having an advantage of lowering the resistance of the hole-surrounding power wiring.

Below, cross-sections of a display device according to still another embodiment of the disclosure will be described.

Figure 13:
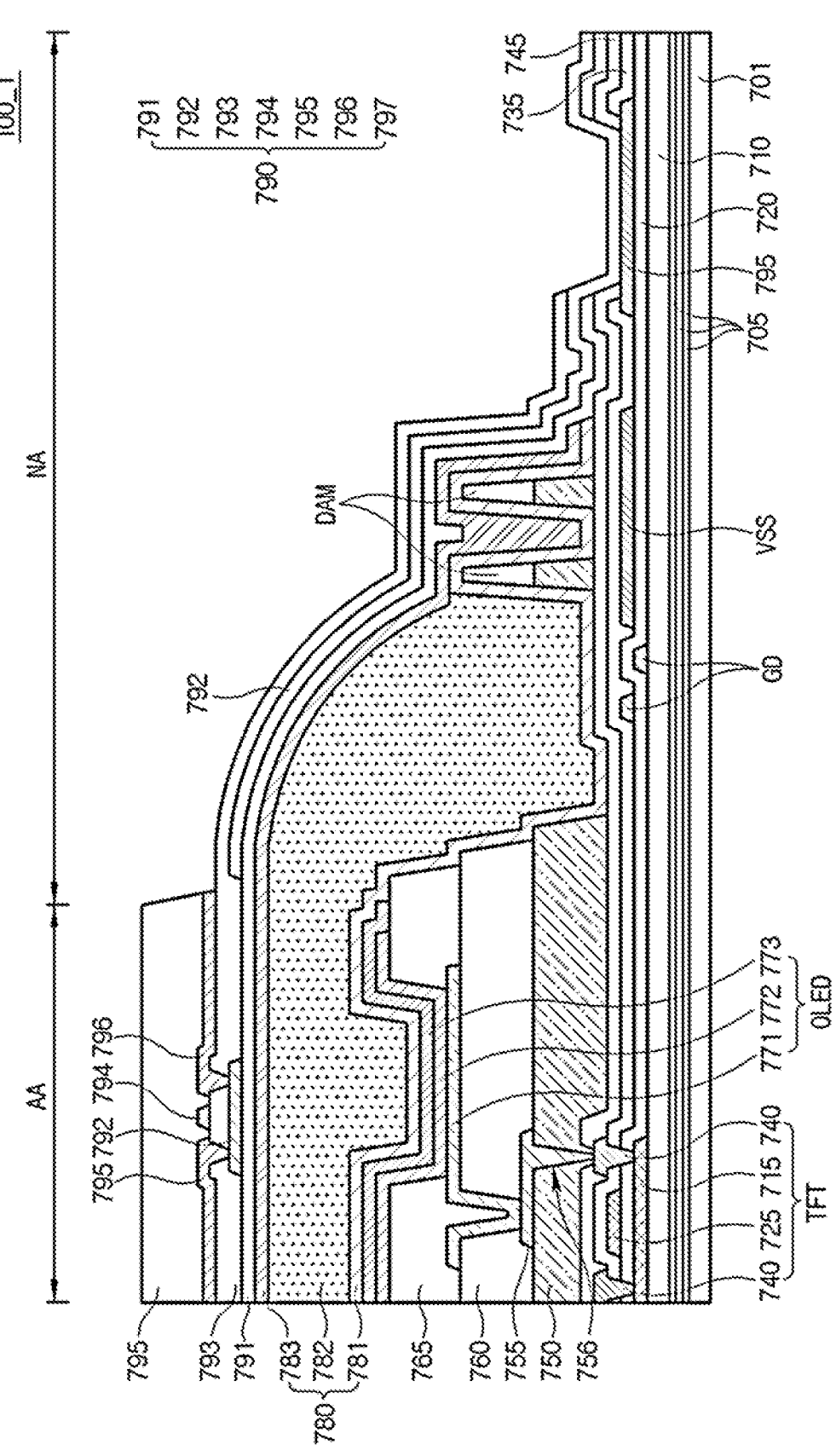
FIG. 13 is a cross-sectional view of a display device according to still another embodiment of the disclosure.

FIG. 13 is a cross-sectional view of a display device according to still another embodiment of the disclosure.

Referring to FIG. 13, a thin film transistor TFT for driving a light-emitting diode OLED can be disposed in a display area (active area) AA on a substrate 701. The thin film transistor TFT can include a semiconductor layer 715, a gate electrode 725, and a source and drain electrodes 740. The thin film transistor TFT is a driving transistor (DT) (see FIG. 4). For the convenience of description, only the driving transistor (DT) among various thin film transistors included in the display device is illustrated, but another thin film transistors such as a switching transistor can also be included in the display device. Further, the thin film transistor TFT according to the disclosure has a coplanar structure, but is not limited thereto. Alternatively, the thin film transistor can be implemented to have other structures such as a staggered structure.

The driving transistor (DT) can adjust the amount of light emitted from the light-emitting diode OLED by controlling the current supplied to the light-emitting diode OLED with a high-potential driving voltage EVDD received in response to a data signal transmitted to the gate electrode 725 of the driving transistor (DT), and maintain the light emission of the light-emitting diode OLED by supplying a constant current with a voltage charged in a storage capacitor until receiving the data signal of the next frame. A high-potential supplying line can be formed in parallel with the data line.

As shown in FIG. 13, the thin film transistor TFT can include the semiconductor layer 715 disposed on a first insulating layer 710, the gate electrode 725 overlapping the semiconductor layer 715 with a second insulating layer 720 therebetween, and the source and drain electrodes 740 formed on a third insulating layer 735 and being in contact with the semiconductor layer 715.

The semiconductor layer 715 can be an area where a channel is formed when the thin film transistor TFT is driven. The semiconductor layer 715 can be formed as an oxide semiconductor, formed of various organic semiconductors such as amorphous silicon (a-Si), polycrystalline silicon (poly-Si), and pentacene. The semiconductor layer 715 can be formed on the first insulating layer 710. The semiconductor layer 715 can include the channel area, the source area, and the drain area. The channel area can overlap the gate electrode 725 with the second insulating layer 720 therebetween, thereby forming the channel area between the source and drain electrodes 740. The source area can be electrically connected to the source electrode 740 through the contact hole formed penetrating the second insulating layer 720 and the third insulating layer 735. The drain area can be electrically connected to the drain electrode 740 through the contact hole formed penetrating the second insulating layer 720 and the third insulating layer 735. A buffer layer 705 and the first insulating layer 710 can be disposed between the semiconductor layer 715 and the substrate 701. The buffer layer 705 can delay diffusion of water and/or oxygen permeated into the substrate 701. The first insulating layer 710 can protect the semiconductor layer 715 and block various defects introduced from the substrate 701.

The top layer of the buffer layer 705 being in contact with the first insulating layer 710 can be formed of a material different in etching properties from the other layers of the buffer layer 705, the first insulating layer 710, the second insulating layer 720, and the third insulating layer 735. The top layer of the buffer layer 705, which is in contact with the first insulating layer 710, can be formed of one of silicon nitride (SiN$_x$) and silicon oxide (SiO$_x$). The other layers of the buffer layer 705, the first insulating layer 710, the second insulating layer 720, and the third insulating layer 735 can be formed of the other one of silicon nitride (SiN$_x$) and silicon oxide (SiO$_x$). For example, without limitation, the top layer of the buffer layer 705 being in contact with the first insulating layer 710 can be formed of silicon nitride (SiN$_x$), and the other layers of the buffer layer 705, the first insulating layer 710, the second insulating layer 720, and the third insulating layer 735 can be formed of silicon oxide (SiO$_x$).

The gate electrode 725 can be formed on the second insulating layer 720, and overlap the channel area of the semiconductor layer 715 with the second insulating layer 720 therebetween. The gate electrode 725 can be formed of, but not limited to, a first conductive material as a single layer or a multiple layer, which contains one of magnesium (Mg), molybdenum (Mo), aluminum (Al), chromium (Cr), gold (Au), titanium (Ti), nickel (Ni), neodymium (Nd), and copper (Cu), or an alloy thereof.

The source electrode 740 can be connected to the source area of the semiconductor layer 715 exposed through the contact hole formed penetrating the second insulating layer 720 and the third insulating layer 735. The drain electrode 740 can face the source electrode 740, and be connected to the drain area of the semiconductor layer 715 through the contact hole formed penetrating the second insulating layer 720 and the third insulating layer 735. Such source and drain electrodes 740 can be formed of, but not limited to, a second conductive material as a single layer or a multiple layer, which contains one of molybdenum (Mo), aluminum (Al), chromium (Cr), gold (Au), titanium (Ti), nickel (Ni), neodymium (Nd), and copper (Cu), or an alloy thereof.

A connection electrode 755 can be disposed between a first intermediate layer 750 and a second intermediate layer 760. The connection electrode 755 can be exposed through a connection electrode contact hole 756 formed penetrating a protection film 745 and the first intermediate layer 750 and connected to the drain electrode 740. The connection electrode 755 can be made of, but not limited to, a material having low specific resistivity, which is the same as or similar to the drain electrode 740.

Referring to FIG. 13, the light-emitting diode OLED including a light-emitting layer 772 can be disposed on the second intermediate layer 760 and a bank layer 765. The light-emitting diode OLED can include an anode 771, at least one light-emitting layer 772 formed on the anode 771, and a cathode 773 formed on the light-emitting layer 772.

The anode 771 can be formed on the first intermediate layer 750 through the contact hole formed penetrating the second intermediate layer 760, and electrically connected to the connection electrode 755 exposed to the top of the first intermediate layer 750.

The anode 771 of each pixel is formed to be exposed by the bank layer 765. The bank layer 765 can be formed of an opaque material (e.g., black) to prevent optical interference between adjacent pixels. In this case, the bank layer 765 can include a light shielding material made of, but not limited thereto, at least one of color pigment, organic black and carbon.

Referring to FIG. 13, at least one light-emitting layer 772 can be formed on the anode 771 in a light emission area provided by the bank layer 765. The at least one light-emitting layer 772 can include the hole transport layer, the hole injection layer, the hole blocking layer, the light-emitting layer 772, the electron injection layer, the electron blocking layer, the electron transport layer, etc. on the anode 771, which are stacked in order or in reverse order according to light-emitting directions. Besides, the light-emitting layer 772 can include first and second light-emitting stacks opposite to each other with a charge generating layer therebetween. In this case, the light-emitting layer 772 in one of the first and second light-emitting stacks emits blue light, and the light-emitting layer 772 in the other one of the first and second light-emitting stacks emits yellow-green light, thereby generating white light through the first and second light-emitting stacks. The white light generated in these light-emitting stacks is incident on a color filter positioned above or below the light-emitting layer 772, thereby implementing a color image. Alternatively, colored light can be generated corresponding to each pixel in each light-emitting layer 772 without separate color filters, thereby implementing a color image. For example, the light-emitting layer 772 of a red pixel can generate red light, the light-emitting layer 772 of a green pixel can generate green light, and the light-emitting layer 772 of a blue pixel can generate blue light.

Referring to FIG. 13, the cathode 773 can be formed to face the anode 771 with the light-emitting layer 772 therebetween, and receive the high-potential driving voltage EVDD.

An encapsulation layer 780 prevents external water or oxygen from permeating the light-emitting diode OLED vulnerable to water or oxygen. To this end, the encapsulation layer 780 includes, but is not limited to, at least one inorganic encapsulation layer, and at least one organic encapsulation layer. According to the disclosure, it will be described by way of example that the encapsulation layer 780 has a structure where a first encapsulation layer 781, a second encapsulation layer 782 and a third encapsulation layer 783 are stacked in sequence.

The first encapsulation layer 781 is formed on the substrate 701 formed with the cathode 773. The third encapsulation layer 783 is formed on the substrate 701 formed with the second encapsulation layer 782, and formed to, together with the first encapsulation layer 781, surround the top, bottom and lateral sides of the second encapsulation layer 782. The first encapsulation layer 781 and the third encapsulation layer 783 can minimize or prevent the permeation of external water or oxygen into the light-emitting diode OLED. The first encapsulation layer 781 and the third encapsulation layer 783 can be formed of inorganic insulating materials such as silicon nitride (SiN$_x$), silicon oxide (SiO$_x$), silicon oxynitride (SiON) or aluminum oxide (Al$_2$O$_3$) which can be deposited at a low temperature. Because the first encapsulation layer 781 and the third encapsulation layer 783 are deposited at a low temperature atmosphere, the light-emitting diode OLED vulnerable to high temperature atmosphere is prevented from being damaged when the first encapsulation layer 781 and the third encapsulation layer 783 are subjected to a deposition process.

The second encapsulation layer 782 serves as a buffer to relieve stress between the layers due to bending of the display device, and levels out a stepped portion between the layers. The second encapsulation layer 782 can be formed of a non-photosensitive inorganic insulating material such as acryl resin, epoxy resin, phenolic resin, polyamide resin, polyimide resin and polyethylene or silicon oxycarbon (SiOC) or a photosensitive inorganic insulating material such as photo-acryl on the substrate 701 formed with the first encapsulation layer 781, but not limited thereto. When the second encapsulation layer 782 is formed by an inkjet method, a dam DAM can be disposed to prevent the second encapsulation layer 782 in a liquid state from spreading over to the edges of the substrate 701. The dam DAM can be disposed closer to the edge of the substrate 701 than the second encapsulation layer 782. By the dam DAM, the second encapsulation layer 782 is prevented from spreading to a pad area where a conductive pad disposed at the outmost edge of the substrate 701 is disposed.

The dam DAM is designed to prevent the second encapsulation layer 782 from spreading. However, if the second encapsulation layer 782 is formed beyond the height of the dam DAM during the process, the organic layer, i.e., the second encapsulation layer 782 can be exposed to the outside so that water or the like can easily permeate into the light-emitting diode. Therefore, to prevent this, at least ten dams DAM can be formed to be duplicated.

Referring to FIG. 13, the dam DAM can be disposed on the protection film 745 of the non-display area NA.

Further, the dam DAM can be formed simultaneously with the first intermediate layer 750 and the second intermediate layer 760. A lower layer of the dam DAM can be formed together with the formation of the first intermediate layer 750, and an upper layer of the dam DAM can be formed together with the second intermediate layer 760. Thus, the dam DAM is formed as a dual stacked structure.

Therefore, the dam DAM can be made of the same material as the first intermediate layer 750 and the second intermediate layer 760, but not limited thereto.

Referring to FIG. 13, the dam DAM can be formed overlapping a low-potential driving power line VSS. For example, the low-potential driving power line VSS can be formed as a layer under an area where the dam DAM is positioned within the non-display area NA.

The low-potential driving power line VSS and the gate driver GD formed as a gate in panel (GIP) can be formed to surround the periphery of the display panel, and the low-potential driving power line VSS can be positioned further outside than the gate driver GD. Further, the low-potential driving power line VSS is connected to the anode 771 to supply a common voltage. The gate driver GD is simply illustrated in the plan view and the cross-sectional view, but can be configured with the thin film transistor TFT having the same structure as the thin film transistor TFT of the display area AA.

Referring to FIG. 13, the low-potential driving power line VSS is disposed further outside than the gate driver GD. The low-potential driving power line VSS is disposed outside the gate driver GD, and surrounds the display area AA. The low-potential driving power line VSS can be made of the same material as the source and drain electrodes 740 of the thin film transistor TFT, but not limited thereto. For example, the low-potential driving power line VSS can be made of the same material as the gate electrode 725.

Further, the low-potential driving power line VSS can be electrically connected to the anode 771. The low-potential driving power line VSS can supply a low-potential driving voltage EVSS to the plurality of pixels within the display area AA.

A touch layer 790 can be disposed on the encapsulation layer 780. In the touch layer 790, a touch buffer layer 791 can be positioned between the cathode 773 of the light-emitting diode OLED and touch sensor metal including touch electrode connection lines 792 and 794 and touch electrodes 795 and 796.

The touch buffer layer 791 can block permeation of a chemical solution (e.g., a development solution of an etching solution) used in a process of fabricating the touch sensor metal disposed on the touch buffer layer 791, water from the outside, etc. into the light-emitting layer 772 including the organic material. Thus, the touch buffer layer

791 prevents the light-emitting layer 772 vulnerable to the chemical solution or water from being damaged.

The touch buffer layer 791 is formed of an organic insulating material, which can be formed at a low temperature below a certain temperature (e.g., 100 degrees Celsius (° C.)) and has a low dielectric constant of 1 to 3, to prevent the light-emitting layer 772 including an organic material vulnerable to high temperature from being damaged. For example, the touch buffer layer 791 can be formed of an acrylic-based, epoxy-based, or siloxane-based material. The touch buffer layer 791, which is an organic insulating material and has planarization performance, can prevent the encapsulation layer 780 from being damaged and the touch sensor metal formed on the touch buffer layer 791 from being broken due to the bending of the organic light-emitting display device.

In the touch sensor structure based on mutual capacitance, the touch electrodes 795 and 796 can be disposed on the touch buffer layer 791, and the touch electrodes 795 and 796 can be disposed to intersect each other.

The touch electrode connection lines 792 and 794 can electrically connect the touch electrodes 795 and 796. The touch electrode connection lines 792 and 794 and the touch electrodes 795 and 796 can be positioned at different layers with a touch insulating film 793 therebetween.

The touch electrode connection lines 792 and 794 are disposed to overlap the bank layer 765 and prevent an aperture from being lowered.

Meanwhile, in the touch electrodes 795 and 796, a part of the touch electrode connection line 792 can be electrically connected to a touch driving circuit through a touch pad 198 via a touch pad 198 via the top and lateral side of the encapsulation layer 780 and the top and lateral side of the dam DAM.

The part of the touch electrode connection line 792 can receive a touch driving signal from a touch driving circuit and transmit the touch driving signal to the touch electrodes 795 and 796, and can also transmit a touch sensing signal from the touch electrodes 795 and 796 to the touch driving circuit.

A touch protection film 797 can be disposed on the touch electrodes 795 and 796. In the accompanying drawings, the touch protection film 797 is disposed only the touch electrodes 795 and 796, but not limited thereto. Alternatively, the touch protection film 797 can also be disposed on the touch electrode connection line 792 as extended even to the front or rear of the dam DAM.

In addition, a color filter can further be disposed on the encapsulation layer 780. Alternatively, the color filter can be positioned on the touch layer 790, or can also be positioned between the encapsulation layer 780 and the touch layer 790.

The stacked structures or elements in the cross-sectional view of the foregoing display device of FIG. 13 can be applied to the display device 1 of FIGS. 1 to 3. The stacked structures or elements of the display device of FIG. 13 belong to the same technical field as the display device 1 of FIGS. 1 to 3, and thus combinations therebetween are obvious. In other words, the stacked structures or elements in the cross-sectional view within the non-display area (non-active area) NA of the display device of FIG. 13 can be applied to the first non-display area NDA1 of the display device 1 of FIG. 3, and the stacked structures or elements in the cross-sectional view within the display area AA can be applied to the display area DA of the display device 1 of FIG. 3.

Figure 14:
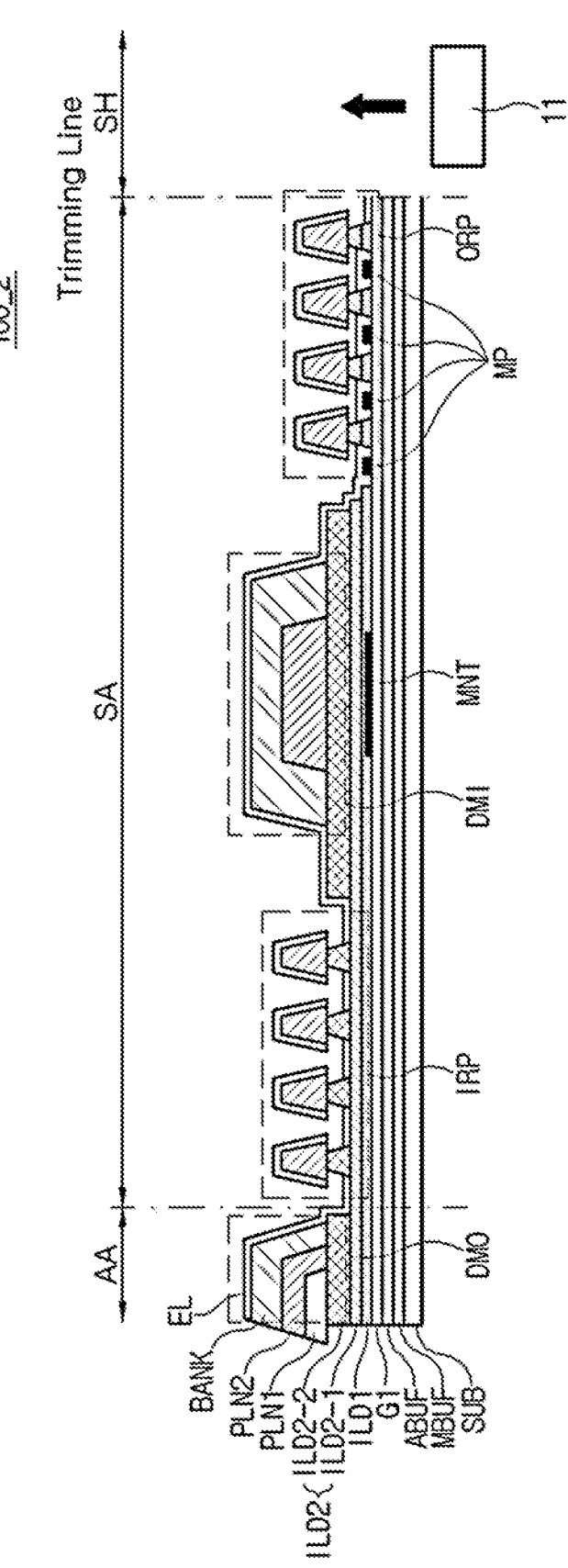
FIG. 14 is a cross-sectional view of a display device according to still another embodiment of the disclosure.

FIG. 14 is a cross-sectional view of a display device according to still another embodiment of the disclosure.

Referring to FIG. 14, an optical area OA includes a through hole TH and a peripheral area SA, and the display area AA can be positioned outside the peripheral area SA. The display area AA can correspond to the display area DA of FIG. 3, and the through hole TH can correspond to the sensor hole SH of FIG. 3, and the peripheral area SA can correspond to the second non-display area NDA2 of FIG. 3.

In the through hole TH, an optical electronic device can be positioned below the display panel and at least partially overlap the through hole TH.

Referring to FIG. 14, the display device according to embodiment of the disclosures can include a "dam structure" such as an outer dam DMO positioned in the display area AA, and an inner dam DMI positioned in the peripheral area SA. Such a dam structure can include a triple-layered structure formed perpendicularly to a substrate SUB. For example, the dam structure can include a first layer formed as a planarization layer PLN, a second layer formed as a bank, and a third layer formed as a spacer.

Referring to FIG. 14, a first planarization layer PLN1 and a second planarization layer PLN2 described above are schematically illustrated as the planarization layer PLN. In such a dam structure, at least a portion of a light-emitting layer EL can be positioned on a spacer.

Some elements of the light-emitting diode can be stacked on the inner dam DMI. For example, the light-emitting layer EL and the common electrode can be stacked in the form of climbing over the inner dam DMI.

The concavo-convex pattern RP is positioned inside and outside such an inner dam DMI. The concavo-convex pattern RP can include a mountain including insulating layers ILD1, ILD2-1, ILD2-2, and a valley where at least some of the insulating layers are removed.

The light-emitting layer EL can be positioned in at least some areas on the concavo-convex pattern RP. The light-emitting layer EL can include the organic light-emitting layer including the organic material. The light-emitting layer EL can be extended from the display area AA to at least a portion of the peripheral area SA.

Referring to FIG. 14, the light-emitting layer EL is discontinuously positioned in an inner concavo-convex pattern IRP and an outer concavo-convex pattern ORP. Accordingly, even though moisture introduced from the through hole TH is permeated into the light-emitting layer EL positioned in the peripheral area SA, the moisture does not permeate up to the light-emitting layer EL positioned in the display area AA. In other words, the light-emitting layer EL is discontinuously present in the concavo-convex pattern RP, thereby having an effect on lengthening a moisture permeation path and an effect on preventing moisture introduced into the light-emitting layer EL from diffusing up to the display area AA.

Meanwhile, referring to FIG. 14, the inner concavo-convex pattern IRP and the outer concavo-convex pattern ORP can be different in the height of the mounting. The height of the mounting in the inner concavo-convex pattern IRP can be higher than the height of the mounting in the outer concavo-convex pattern ORP.

The inner concavo-convex pattern IRP and the outer concavo-convex pattern ORP are different in the height of the mountain because the interlayer insulating films ILD1, ILD2-1, and ILD2-2 included in the mountain are different in the inner concavo-convex pattern IRP and the outer concavo-convex pattern ORP.

For example, referring to FIG. 14, the mountain of the inner concavo-convex pattern IRP can include a 2-2th interlayer insulating film ILD2-2, and may not include a 2-1th interlayer insulating film ILD2-1 and a first interlayer insulating film ILD1. The mountain of the outer concavo-convex pattern ORP can include a 2-1th interlayer insulating film ILD2-1 and a first interlayer insulating film ILD1, and may not include a 2-2th interlayer insulating film ILD2-2.

Meanwhile, referring to FIG. 14, the bottom of the valley positioned in the outer concavo-convex pattern ORP can be positioned below the bottom of the valley positioned in the inner concavo-convex pattern IRP.

For example, the valley in the outer concavo-convex pattern ORP can be formed by removing at least a portion (e.g., the 2-1th interlayer insulating film ILD2-1) of the first interlayer insulating film ILD1 and the second interlayer insulating film ILD2.

Referring to FIG. 14, while the valley of the concavo-convex pattern RP is formed by removing the first interlayer insulating film ILD1 from the outer concavo-convex pattern ORP, a gate insulating film GI can be damaged, or insulating films (e.g., ABUF, MBUF, etc.) positioned below the gate insulating film GI can be damaged.

Thus, a metal pattern (MP) can be positioned in the valley positioned in the outer concavo-convex pattern ORP.

Referring to FIG. 14, the metal pattern MP can for example be disposed in the peripheral area SA, having the same shape as the valley positioned in the outer concavo-convex pattern ORP. The metal pattern MP positioned corresponding to the valley of the concavo-convex pattern RP can function as an "etching stopper."

Alternatively, the metal pattern MP can be positioned overlapping the mountain positioned in the outer concavo-convex pattern ORP. In other words, metal pattern MP can be widely positioned below the outer concavo-convex pattern ORP. In this case, the metal pattern MP can also function to prevent microcracks generated in the through hole TH from extending up to the display area AA. In this case, the metal pattern MP can function as not only the etching stopper but also the crack stopper.

The metal pattern MP can be positioned on the gate insulating film GI. The metal pattern MP can be formed of the same material as the gate electrode GATE of the driving transistor DRT of FIG. 3 described above.

The metal pattern MP can be made of a material different from that of the insulating films (e.g., the gate insulating film GI, and the first interlayer insulating film ILD1) positioned above and below the metal pattern MP. Therefore, even though the insulating film (e.g., the first interlayer insulating film ILD1) covering the metal pattern MP is removed in an etching process or the like, the insulating film (e.g., the gate insulating film GI) positioned below the metal pattern MP is protected.

Meanwhile, an alignment mark MNT can be positioned in the peripheral area SA. The alignment mark MNT can also be referred to as an "alignment key." The alignment mark MNT can be disposed on a substrate SUB to form the through hole TH by etching a predetermined area from the substrate SUB.

The alignment mark MNT can be disposed in the peripheral area SA in the form of a shape corresponding to the shape of the through hole TH, or can be disposed around the through hole TH in the form of a shape different from the shape of the through hole TH. The alignment mark MNT can for example be positioned only in some areas among upper, lower, left and right areas of the through hole TH.

Meanwhile, the alignment mark MNT can be positioned on the same layer as the metal pattern MP. For example, the alignment mark MNT can be formed of the same material as the gate electrode GATE. The alignment mark MNT can be positioned on the gate insulating film GI. The alignment mark MNT can be positioned being covered with the first interlayer insulating film ILD1.

The alignment mark MNT can for example be positioned in an area overlapping the inner dam DMI. The alignment mark MNT can for example be positioned between the inner concavo-convex pattern IRP and the outer concavo-convex pattern ORP.

The stacked structures or elements in the cross-sectional view of the foregoing display device of FIG. 14 can be applied to the display device 1 of FIGS. 1 to 3. The stacked structures or elements of the display device of FIG. 14 belong to the same technical field as the display device 1 of FIGS. 1 to 3, and thus combinations therebetween are obvious. In other words, the stacked structures or elements in the cross-sectional view within the peripheral area SA of the display device of FIG. 14 can be applied to the second non-display area NDA2 of the display device 1 of FIG. 3, and the stacked structures or elements in the cross-sectional view within the display area AA can be applied to the display area DA of the display device 1 of FIG. 3.

Although a few embodiments have been described in more detail with reference to the accompanying drawings, it will be understood by a person having ordinary knowledge in the art to which the disclosure pertains that the different embodiments can be made without departing from the technical spirit or features. Accordingly, the embodiments described above should be understood to be illustrative and non-limiting in all respects.

What is claimed is:

1. A display device comprising:
a display area comprising pixels disposed on a substrate;
a sensor hole area disposed in the display area;
a sensor non-display area disposed between the display area and the sensor hole area; and
a plurality of scan wirings disposed on the substrate, connected to the pixels, extended along a first direction, and bypassing the sensor hole area in the sensor non-display area,
wherein the plurality of scan wirings comprises a first scan wiring, and a second scan wiring disposed between the first scan wiring and the sensor hole area, and
wherein the second scan wiring has a larger width than the first scan wiring.

2. The display device of claim 1, further comprising a plurality of data wirings disposed on the substrate, connected to the pixels, extended along a second direction intersecting the first direction, and bypassing the sensor hole area in the sensor non-display area.

3. The display device of claim 2, wherein the plurality of data wirings comprises a first data wiring, and a second data wiring disposed between the first data wiring and the sensor hole area, and
the second data wiring has a larger width than the first data wiring.

4. The display device of claim 3, wherein the plurality of scan wirings is disposed in a first conductive layer on the substrate.

5. The display device of claim 4, wherein the plurality of data wirings is disposed in a second conductive layer on the first conductive layer.

6. The display device of claim 5, further comprising a third conductive layer disposed between the first conductive layer and the second conductive layer, and comprising a high-voltage power wiring connected to the pixels, wherein the high-voltage power wiring comprises a hole-surrounding high-voltage power wiring that surrounds the sensor non-display area on a plane.

7. The display device of claim 6, wherein the high-voltage power wiring further comprises a first high-voltage power wiring disposed at a first side of the hole-surrounding high-voltage power wiring on a plane and extended along the second direction intersecting the first direction.

8. The display device of claim 7, wherein the hole-surrounding high-voltage power wiring has a larger width than the first high-voltage power wiring.

9. The display device of claim 6, wherein the high-voltage power wiring does not overlap the sensor non-display area.

10. The display device of claim 6, wherein the high-voltage power wiring further comprises:
an upper high-voltage power wiring disposed at an upper side of the hole-surrounding high-voltage power wiring on a plane and connected to the hole-surrounding high-voltage power wiring, and
a lower high-voltage power wiring disposed at a lower side of the hole-surrounding high-voltage power wiring on a plane and connected to the hole-surrounding high-voltage power wiring.

11. The display device of claim 10, wherein the upper high-voltage power wiring and the lower high-voltage power wiring are extended along the second direction.

12. The display device of claim 6, wherein the hole-surrounding high-voltage power wiring includes a first hole-surrounding power wiring layer and a second hole-surrounding power wiring layer, and
the second hole-surrounding power wiring layer includes a 2-1th hole-surrounding power wiring portion and a 2-2th hole-surrounding power wiring portion disposed being spaced apart from each other with one of the plurality of scan wirings therebetween on a plane.

13. The display device of claim 7, wherein the first high-voltage power wiring includes a first power wiring layer and a second power wiring layer, and
the second power wiring layer includes a 2-1th power wiring portion, and a 2-2th power wiring portion disposed being spaced apart from each other with one of the plurality of scan wirings therebetween on a plane.

14. A display device comprising:
a display area comprising pixels on a substrate;
a sensor hole area disposed in the display area;
a sensor non-display area disposed between the display area and the sensor hole area;
a first conductive layer comprising a scan wiring disposed on the substrate, connected to the pixels, extended along a first direction, and bypassing the sensor hole area in the sensor non-display area; and
a second conductive layer disposed on the first conductive layer and comprising a data wiring disposed on the substrate, connected to the pixels, extended along a second direction intersecting the first direction, and bypassing the sensor hole area in the sensor non-display area,
wherein the scan wiring and the data wiring comprise a plurality of scan wirings and a plurality of data wirings, respectively, and
wherein a bypassing portion of the plurality of scan wirings with respect to the sensor hole area and a bypassing portion of the plurality of data wirings with respect to the sensor hole area are disposed to alternate with each other on a plane.

15. The display device of claim 14, wherein the bypassing portion of the plurality of scan wirings with respect to the sensor hole area and the bypassing portion of the plurality of data wirings with respect to the sensor hole area are disposed not to overlap with each other.

16. The display device of claim 14, further comprising a third conductive layer disposed between the first conductive layer and the second conductive layer, wherein the third conductive layer comprises a high-voltage power wiring, and the high-voltage power wiring comprises a hole-surrounding high-voltage power wiring that surrounds the sensor non-display area on a plane.

17. The display device of claim 16, wherein the high-voltage power wiring comprises a first high-voltage power wiring disposed at a first side of the hole-surrounding high-voltage power wiring on a plane and extended along the second direction intersecting the first direction.

18. The display device of claim 17, wherein the hole-surrounding high-voltage power wiring has a larger width than the first high-voltage power wiring.

19. A display device comprising:

a display area comprising pixels on a substrate;

a sensor hole area disposed in the display area;

a sensor non-display area disposed between the display area and the sensor hole area; and a plurality of scan wirings disposed on the substrate, connected to the pixels, extended along a first direction, and bypassing the sensor hole area in the sensor non-display area, wherein the plurality of scan wirings comprises a first scan wiring, and a second scan wiring disposed between the first scan wiring and the sensor hole area, and wherein a light-emitting layer is discontinuously positioned in an inner concavo-convex pattern and an outer concavo-convex pattern disposed in the sensor non-display area.

20. The display device of claim 19, wherein a metal pattern disposed in the sensor non-display area has a same shape as a valley positioned in the outer concavo-convex pattern, and the metal pattern positioned corresponding to the valley of the outer concavo-convex pattern functions as an etching stopper.

* * * * *